(12) United States Patent
Terauchi et al.

(10) Patent No.: US 6,707,154 B2
(45) Date of Patent: Mar. 16, 2004

(54) SEMICONDUCTOR DEVICE AND PRODUCTION METHOD FOR THE SAME

(75) Inventors: Takashi Terauchi, Hyogo (JP); Masahiro Shimizu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 63 days.

(21) Appl. No.: 09/755,180

(22) Filed: Jan. 8, 2001

(65) Prior Publication Data

US 2002/0001936 A1 Jan. 3, 2002

(30) Foreign Application Priority Data

Jun. 30, 2002 (JP) .......................... 2000-198581

(51) Int. Cl.[7] .......................... H01L 23/43; H01L 23/52; H01L 29/40
(52) U.S. Cl. .......................... 257/754; 257/758
(58) Field of Search .......................... 257/622, 758, 257/750, 754, 755, 757; 438/637, 622, 639, 649, 682, 672

(56) References Cited

U.S. PATENT DOCUMENTS

| | | | |
|---|---|---|---|
| 5,914,279 A | * | 6/1999 | Yang et al. |
| 5,955,768 A | * | 9/1999 | Liaw et al. |
| 6,100,138 A | * | 8/2000 | Tu |
| 6,117,733 A | * | 9/2000 | Sung et al. |
| 6,303,953 B1 | * | 10/2001 | Doan et al. |
| 6,410,984 B1 | * | 6/2002 | Trivedi et al. |

FOREIGN PATENT DOCUMENTS

| | | |
|---|---|---|
| JP | 7-122518 | 5/1995 |
| JP | 10-144787 | 5/1998 |
| JP | 11-214515 | 8/1999 |

* cited by examiner

*Primary Examiner*—Sheila V.. Clark
(74) *Attorney, Agent, or Firm*—McDermott, Will & Emery

(57) ABSTRACT

Wires are formed on the main surface of a semiconductor substrate via a silicon oxide film. A nitride film is formed on the wires and the upper edge corner parts of the nitride film are rounded. Another nitride film, covering the nitride film, is formed and an interlayer oxide film is formed so as to cover this film. Contact holes are formed in the interlayer oxide film which reach the nitride film as well as the main surface of the semiconductor substrate and plug parts are formed within those contact holes.

24 Claims, 27 Drawing Sheets

SEMICONDUCTOR DEVICE AND PRODUCTION METHOD FOR THE SAME

BACKGROUND OF THE INVENTION

1. Field of the Invention

The present invention relates to a semiconductor device having contact parts according to a self-alignment method and production method for the same.

2. Prior Art

The integration degree of semiconductor devices has increased in recent years while memory cells have been scaled down and, at the same time, it has become difficult to open contact holes between wires, by using solely a photoresist mask, without causing short circuiting from the wires. Therefore, a method called the self-alignment method is adopted as a method for opening contact holes without short circuiting the wires.

In the following, a structure of a conventional semiconductor device as well as its production method in the case that a self-alignment method is adopted are described in reference to FIG. 61.

As shown in FIG. 61 isolation regions 11 are selectively formed on the main surface of a semiconductor substrate 10. Then a silicon oxide film 1 is formed on the main surface of the semiconductor substrate 10 and the wiring is formed thereon. The wires have a polycrystal silicon film 2 and a silicide film 3.

On the wiring a nitride film (a hard mask film) 4 is formed. A silicon oxide film 5 is also formed on the side walls of the wires. At this time the oxidation rate of the silicide film 3 is faster than that of the polycrystal silicon film 2 and, therefore, the silicon oxide film 5 has a shape which locally projects to the side.

A nitride film 6 is formed so as to cover the silicon oxide film 5 and nitride film 4. A silicon oxide film 7 is formed so as to cover this nitride film 6 and an interlayer oxide film 8 is formed so as to cover the silicon oxide film 7.

Afterwards contact holes which reach to the main surface of the semiconductor substrate 10 are formed between the wires and conductive layers (plug parts) are formed within the contact holes.

In the above described prior art wherein a self-alignment method is adopted, however, a defective filling of the interlayer oxide film 8 can occur in the case that scaling down has further advanced so that the distance between wires becomes very short.

As for a primary cause of the defective filling of the interlayer oxide film 8, firstly, the fact that the upper edge corner part of the wires as shown in FIG. 61 are squared can be cited. Because of the existence of those squared parts the opening areas on the upper surface of the regions between the wires become smaller so as to cause the easy occurrence of a defective filling. The existence of the projecting parts on the side walls of the wires as shown in FIG. 61 can also be a primary cause of defective fillings. In addition, the steepness of the side of the wires can be a primary cause of defective fillings.

The occurrence of the defective fillings of the interlayer oxide film 8 as described above causes a void 9 between the wires as shown in FIG. 61. In the case that the void 9 has occurred in this way, a conductive layer is filled in, as well as into the void 9, when plug parts are formed within the contact holes in the latter process. Thereby, the contact parts 24 are connected to each other with the conductive layer which is filled in within the void 9 as shown in FIG. 62, which leads to the problem that the plug parts are short circuited with each other. Here, in FIG. 62, active regions are denoted as 22 and wires are denoted as 23.

The development of scaling down has been particularly remarkable in recent years and there is a tendency that the height of the wires have become larger in order to decrease the wiring resistance and, therefore, the situation of the above described problem is more and more prone to occur.

SUMMARY OF THE INVENTION

The present invention is provided to solve the above described problem. The purpose of the present invention is to prevent a short circuit between the plug parts due to defective fillings or the like of the interlayer insulation film between the wires.

A semiconductor device according to one aspect of the present invention comprises a semiconductor substrate having a main surface, wires formed on the main surface with an insulation film interposed, a hard mask film on the wires, a nitride film having rounded upper edge corner parts covering the hard mask film, an interlayer insulation film covering the nitride film and plug parts formed within the interlayer insulation film. Here, in the present invention, the plug parts are referred to as conductive parts formed within the interlayer isolation film so as to connect conductive layers to each other. Accordingly, the plug parts according to the present invention may be formed as a part of wiring in one case and may be formed of a conductive material which is different from that of the wiring in another case.

By rounding the upper edge corner parts of the nitride film as described above, the opening areas of the upper surface of the regions between the wires can be increased in comparison to the case where the upper edge corner parts of the nitride film are not rounded. Thereby, defective fillings of the interlayer insulation film between the wires can be limited.

In the case that the width of the nitride film located on the above described hard mask film is denoted as L and the height from the bottom of the hard mask film to the top of the nitride film is denoted as H, it is preferable for the width a of the rounded part in the nitride film to be in the range of 0<a<L/2 and for the height b of the rounded part to be in the range of 0<b<H. Thereby, the opening areas of the regions between the wires can be effectively increased.

In addition, the hard mask film has, preferably, rounded upper edge corner parts. In this case the upper edge corner parts of the nitride film can be rounded so that the defective fillings of the interlayer insulation film between the wires can be limited.

In the case that the width of the hard mask film is denoted as L and the height is denoted as H it is preferable for the width a of the rounded upper edge corner parts in the hard mask film to be in the range of 0<a<L/2 and for the height b of the rounded parts to be in the range of 0<b<H. Thereby, the opening areas of the regions between the wires can be effectively increased.

A semiconductor device according to another aspect of the present invention comprises a semiconductor substrate having a main surface, wires formed on the main surface with an insulation film interposed, a hard mask film on the wires, an oxide film formed on the side walls of the wires, a nitride film covering the hard mask film and the oxide film, an interlayer insulation film covering the nitride film and plug parts formed within the interlayer insulation film. Then the surface of the oxide film extends substantially in the direction perpendicular to the main surface of the semiconductor substrate without locally projecting to the side.

In this case, since the oxide film formed on the side walls of the wires does not protrude to the side, the defective fillings of the interlayer insulation film between the wires can be controlled in comparison to a prior art wherein the oxide film projects to the side.

The above described wires have a silicon film and a silicide film so that the side of the silicide film is located inward than the side of the silicon film. Then the shift amount of the side of the silicide film to the inner side of the wires from the side of the hard mask film is preferably ½ times or more and 3/2 times or less as large as the thickness of the oxide film located on the side walls of the silicon film.

By properly adjusting the shift amount of the side of the silicide film in this way the surface of the oxide film can be prevented from locally projecting to the side so that the defective fillings of the interlayer insulation film between the wires can be limited.

A semiconductor device according to still another aspect of the present invention comprises a semiconductor substrate having a main surface, wires formed on the main surface with an insulation film interposed, a hard mask film on the wires, a side wall insulation film extending from the side walls of the wires to the side walls of the hard mask film, a nitride film formed on the side wall insulation film, an interlayer insulation film covering the nitride film and plug parts formed within the interlayer insulation film.

By forming a side wall insulation film on the side walls of the wires as described above, it becomes possible to make gradual the slope of the side walls of regions located between the wires. Thereby, the defective fillings of the interlayer insulation film between the wires can be limited.

In the case that the width of the bottom of the above described side walls insulation film is denoted as a1 and the height of the side wall insulation film is denoted as b1, it is preferable for the value of b1/a1 to be larger than 2 and smaller than 15. Thereby, it becomes possible to make gradual the slope of the side walls of the regions located between the wires.

A semiconductor device according to yet another aspect of the present invention comprises a semiconductor substrate having a main surface, wires formed on the main surface with a first insulation film interposed, a hard mask film on the wires, a nitride film covering the hard mask film, an interlayer isolation film covering the nitride film and having contact holes which reach the main surface, a second insulation film covering the side walls of the contact holes and plug parts formed within regions surrounded by the second isolation film.

By covering the side walls of the contact holes with the second insulation film in this way, even in the case that a void is formed in the interlayer insulation film and a conductive material for forming plug parts infiltrates inside the void, short circuiting between this conductive material and the plug parts can be prevented.

A semiconductor device according to yet another aspect of the present invention comprises a semiconductor substrate having a main surface, element isolation regions selectively formed in the semiconductor substrate, first and second wires which are formed on the main surface with an insulation film interposed and which extend in the element isolation regions, a first and second hard mask films on the first and the second wires, a nitride film covering the first and second hard mask films, an interlayer insulation film covering the nitride film, plug parts formed within the interlayer insulation film, first regions located on the isolation regions wherein the gap between the first and the second wires is relatively broad and second regions located on the isolation regions wherein the gap between the first and the second wires is relatively narrow.

By locally expanding or contracting the gap between the wires in this way, the following effects can be gained. In the case that the gap between the wires is locally expanded, the aspect ratio of the regions can be made smaller so that the defective fillings of the interlayer insulation film between the wires can be limited. On the other hand, in the case that the gap between the wires is locally small, the regions between the wires can be locally filled with the nitride film. Thereby, it becomes unnecessary to fill in the interlayer insulation film in the regions so that the defective fillings of the interlayer isolation film in the regions can be controlled.

In the case that the gap between the wires are locally expanded, the gap between the first and the second wires in the first regions is preferably 1.2 times or more and 2.0 times or less as wide as the gap between the first and the second wires in the second regions. Thereby, it becomes possible to make the aspect ratio of expanded regions as desired.

In the case that the gap between the wires is locally contracted, the gap between the first and the second wires in the second regions is preferably 10% or more and 50% or less of the gap between the first and the second wires in the first regions. Thereby, the second regions can be filled with the nitride film.

A semiconductor device according to yet another aspect of the present invention comprises a semiconductor substrate having a main surface, wires formed on the main surface with an insulation film interposed, a hard mask film on the wires, a first nitride film covering the side walls of the hard mask film and the wires, a second nitride film covering the first nitride film and extending on the main surface, an interlayer insulation film covering the second nitride film and plug parts formed within the interlayer insulation film.

By forming the second nitride film as a substrate protective film in this way, it becomes possible to carry out a wet reflow process to the interlayer insulation film. Thereby, the filling in characteristics of the interlayer insulation film can be improved so that the defective fillings of the interlayer insulation film between the wires can be controlled.

The above described interlayer insulation film has contact holes which reach the main surface and the plug parts are formed within the contact holes. In this case it is preferable to form a silicide layer on the main surface located directly below the plug parts. Thereby, the contact resistance between the plug parts and the semiconductor substrate can be reduced.

The semiconductor device is provided with an oxide film between the second nitride film and the main surface and the interlayer insulation film has contact holes reaching the main surface so that the plug parts are formed within the contact holes. The edge parts of the second nitride film project toward the inside of the contact holes. In this case it is preferable for parts of the plug parts to extend under the projecting parts of the second nitride film. Thereby, the contact areas between the plug parts and the semiconductor substrate can be increased and the contact resistance between the plug parts and the semiconductor substrate can be reduced.

A production method for a semiconductor device according to one aspect of the present invention comprises the following steps. Wires and a hard mask film are formed on the main surface of a semiconductor substrate with an insulation film interposed. A nitride film is formed so as to cover the hard mask film. The upper edge corner parts of the nitride film are rounded. An interlayer insulation film is formed so as to cover the nitride film. Plug parts are formed within the interlayer insulation film.

By rounding the above edge corner parts of the nitride film in this way, defective fillings of the interlayer insulation film between the wires can be limited as described above.

A plurality of wires are preferably formed and the step of rounding the upper edge corner parts of the nitride film preferably includes a step of etching the upper edge corner parts of the nitride film under the condition where a resist is left in between the wires. Thereby, the upper edge corner parts of the nitride film can be rounded while protecting the nitride film located between the wires.

A production method for a semiconductor device according to another aspect of the present invention comprises the following steps. Wires and a hard mask film are formed on the main surface of a semiconductor substrate with an insulation film interposed. The upper edge corner parts of the hard mask film are rounded. A nitride film is formed so as to cover the hard mask film. An interlayer insulation film is formed so as to cover the nitride film. Plug parts are formed within the interlayer insulation film.

In the case that the upper edge corner parts of the hard mask film are rounded, the upper edge corner parts of the nitride film can be rounded so that the defective fillings of the interlayer insulation film between the wires can be limited as described above.

A plurality of wires are performed and the step of rounding the upper edge corner parts of the hard mask film preferably includes the step of etching the upper edge corner parts of the hard mask film under the condition that a resist is left in between the wires. Thereby, when the upper edge corner parts of the hard mask film are rounded the side walls of the wires can be protected by the resist.

A production method for a semiconductor device according to still another aspect of the present invention comprises the following steps. Wires, including a silicon film and a silicide film, as well as a hard mask film are formed on the main surface of a semiconductor substrate with an insulation film interposed. The sides of the silicide film are shifted to the inner side of the wires from the sides of the silicon film. An oxide film is formed on the side walls of the wires. A nitride film is formed so as to cover the hard mask film and the oxide film. An interlayer insulation film is formed so as to cover the nitride film. Plug parts are formed within the interlayer insulation film.

By shifting the sides of the silicide film toward the inside of the wires than the sides of the silicon film in this way, the oxide film can be prevented from projecting to the side after the oxide film is formed on the side walls of the wires. Thereby, the defective fillings of the interlayer insulation film between the wires can be limited.

A production method for a semiconductor device according to yet another aspect of the present invention comprises the following steps. Wires and a hard mask film are formed on the main surface of a semiconductor substrate with the first insulation film interposed. The second insulation film is formed so as to cover the hard mask film. The second insulation film is etched and a side wall insulation film is formed so as to extend from the side walls of the wires to the side walls of the hard mask film. A nitride film is formed so as to cover the side wall insulation film. An interlayer insulation film is formed so as to cover the nitride film. Plug parts are formed within the interlayer insulation film.

By forming a side wall insulation film as described above, the side walls in the regions located between the wires can be sloped gently so that the defective fillings of the interlayer insulation film between the wires can be limited.

A production method for a semiconductor device according to still yet another aspect of the present invention comprises the following steps. Wires and a hard mask film are formed on the main surface of a semiconductor substrate with the first insulation film interposed. A nitride film is formed so as to cover the hard mask film. An interlayer insulation film is formed so as to cover the nitride film. Contact holes are formed in the interlayer insulation film. The second insulation film is formed so as to cover the side walls of the contact holes. Plug parts are formed in the regions surrounded by the second isolation film.

By forming an insulation film covering the side walls of the contact holes in this way, even in the case that a conductive material infiltrates into the interlayer insulation film, short circuiting between this conductive material and a plug part can be prevented without fail.

A production method for a semiconductor device according to still another aspect of the present invention comprises the following steps. Wires and a hard mask film are formed on the main surface of a semiconductor substrate with an insulation film interposed. The first nitride film is formed so as to cover the hard mask film. The first nitride film is etched and a side wall insulation film is formed on the side walls of the wires and the hard mask film. The second nitride film is formed so as to extend on the main surface while covering the side wall insulation film. An interlayer insulation film is formed so as to cover the second nitride film. Plug parts are formed within the interlayer insulation film.

By forming an interlayer insulation film under the condition that the second nitride film is formed on the main surface of the semiconductor substrate in this way, a wet reflow process can be carried out on the interlayer insulation film so that the filling in characteristics of the interlayer insulation film can be increased between the wires.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention are described in reference to FIGS. 1 to 60. Here in the embodiments described in the following, the case where the present invention is applied to a semiconductor memory device is described. Therefore, the following semiconductor device is provided with a memory cell array wherein memory cells for storing information are formed and a peripheral circuit part for carrying out the operation control of the memory cells. The present invention, however, is applicable to semiconductor devices other than the semiconductor memory device.

(Embodiment 1)

FIGS. 1 to 13 are the views showing the steps in the production process for a semiconductor device according to the present Embodiment 1.

The important characteristics in the present Embodiment 1 are that the upper edge corner parts of the hard mask film on the wires in a self-alignment contact structure have a rounded shape so that the gap between the upper edge parts of the wires are broadened.

Figure 1:
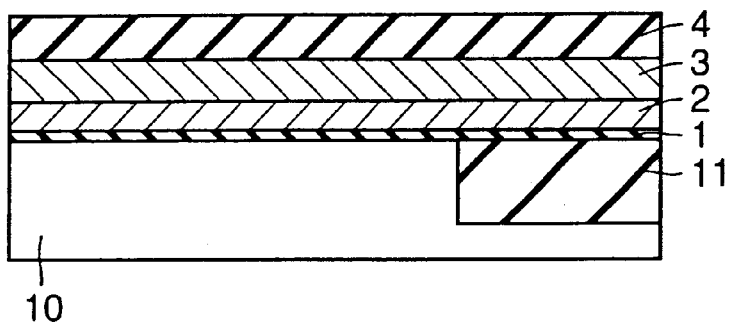
FIGS. 1 to 3 are section views showing the first to the third steps of a production process for a semiconductor device according to Embodiment 1 of the present invention.

As shown in FIG. 1, an isolation region 11 is formed on the main surface of a semiconductor substrate 10 by the method of thermal oxidation and the filling in of the oxide film. The parts other than this isolation region 11 become an active region.

Afterwards, a silicon oxide film 1 is formed on the main surface of the semiconductor substrate 10 by using the thermal oxidation method or a CVD (Chemical Vapor Deposition) method under a reduced pressure or under normal pressure. The silicon oxide film 1 is a non-doped silicon oxide film and the thickness of the silicon oxide film 1 is 5 nm to 10 nm.

A silicon film 2 is deposited on the silicon oxide film 1 by using a CVD method. The silicon film 2 is either a polycrystal silicon film or an amorphous silicon film and an impurity such as P, As or the like is doped in the silicon film 2. Here, the thickness of the silicon film 2 is 40 nm to 100 nm.

A silicide film 3 which is a low resistance film is formed on the silicon film 2. As for the silicide film 3, silicide films of high melting point metals such as $TiSi_2$, WSi or the like can be cited. Instead of the silicide film 3, however, a multi-layered film of silicide films, a multi-layered film formed of a silicide film and a metal film or a metal nitride film may be adopted. The thickness of the silicide film 3 is 40 nm to 100 nm.

A nitride film (hard mask film) 4 is formed on the silicide film 3 by using a CVD method. The thickness of the nitride film 4 is 20 nm to 100 nm. Any film other than the nitride film 4 can be adopted as long as it can secure a selection ratio to a certain extent when the oxide film is etched by an RIE (Reactive Ion Etching) method or the like. More concretely, for example a multi-layered film, including a nitride oxide film or a nitride film and a nitride oxide film, can be adopted.

Figure 2:
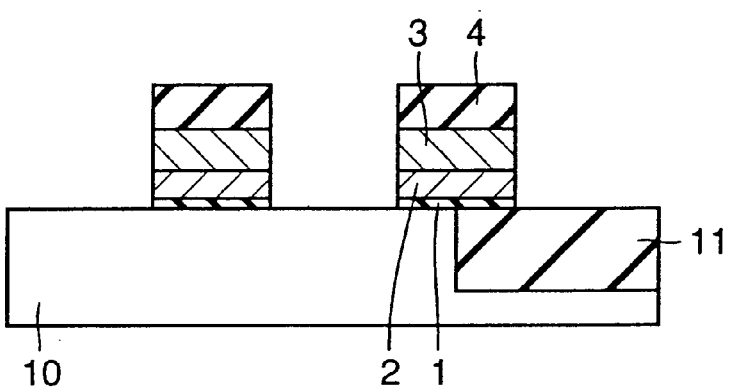

Next, by carrying out a dry etching such as the RIE method through the usage of a photoresist mask, the silicon film 2 and the silicide film 3 are patterned as shown in FIG. 2 to form gate wires.

Figure 3:
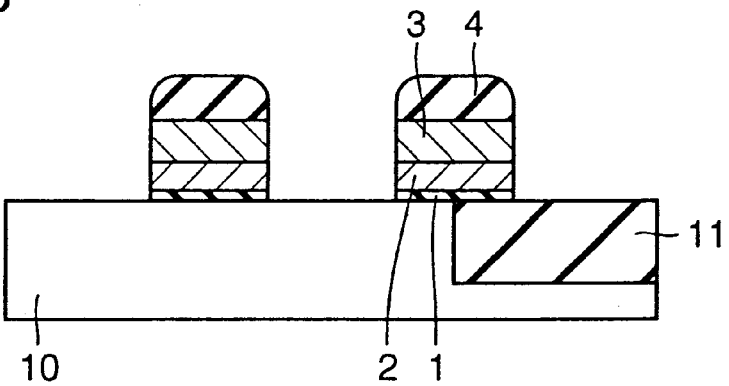

Next, as shown in FIG. 3, the upper edge corner parts of the nitride film 4 are rounded by sputter etching, dry etching or a CMP (Chemical Mechanical Polishing) method or the like. More concretely, the upper edge corner parts of the nitride film 4 can be rounded by using $NF_3$ or Ar as an etching gas and by carrying out etching under the condition the RF power (acceleration voltage) is increased higher than in a normal etching.

Figure 4:
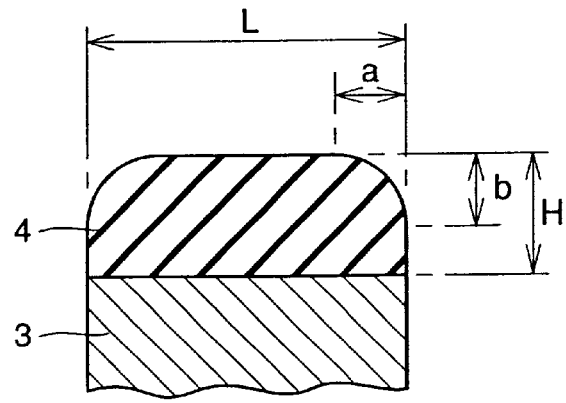
FIG. 4 is an expanded view of the nitride film (hard mask film) as shown in FIG. 3.

FIG. 4 shows an expanded view of the nitride film 4. As shown in FIG. 4, in the case that the width of the nitride film 4 is denoted as L, the height is denoted as H and the width of the rounded part is denoted as a and the height is denoted as b, the ranges of the width a and the height b are represented as $0<a<L/2$ and $0<b<H$. More preferably they should be $a \geq L/4$ and $b \leq H/2$.

Figure 5:
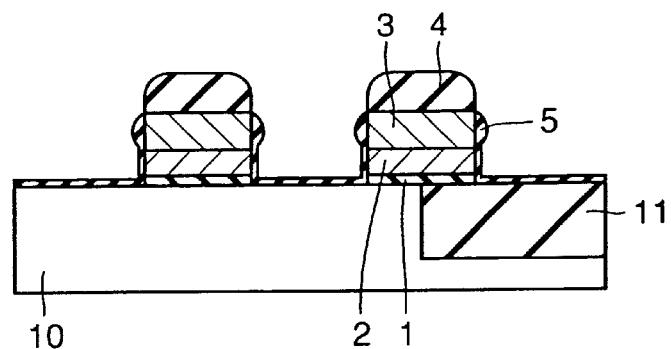
FIGS. 5 to 13 are section views showing the fourth to the twelfth steps of a production process for a semiconductor device according to Embodiment 1 of the present invention.

Next, as shown in FIG. 5, a silicon oxide film 5 is formed, by a thermal oxidation method, on the side walls of the wires and on the main surface of the semiconductor substrate 10 in order to prevent hot carriers. At this time, since the silicide film 3 has a higher oxidation rate than the silicon film 2, the silicon oxide film 5 on the side walls of the wires has a shape locally projecting to the side. Here, the thickness of the silicon oxide film 5 is 5 nm to 10 nm.

Figure 6:
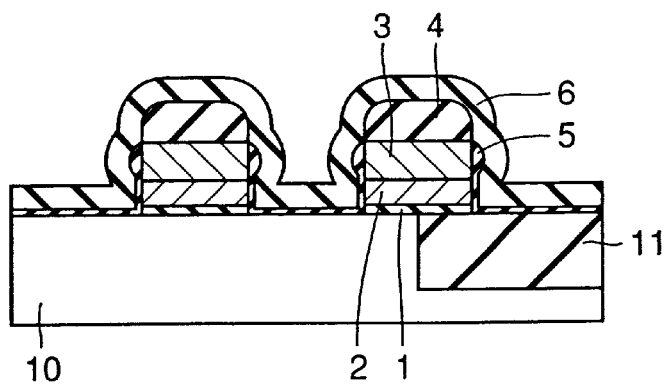

Next, as shown in FIG. 6, a nitride film 6 is deposited in order to protect the tops and the side walls of the wires by using a CVD method. This nitride film 6 is a film which is indispensable for a self-alignment method, of which the thickness is 20 nm to 100 nm. Here, instead of the nitride film 6 a film of a similar material to the type of nitride film 4 may be adopted.

Figure 52:
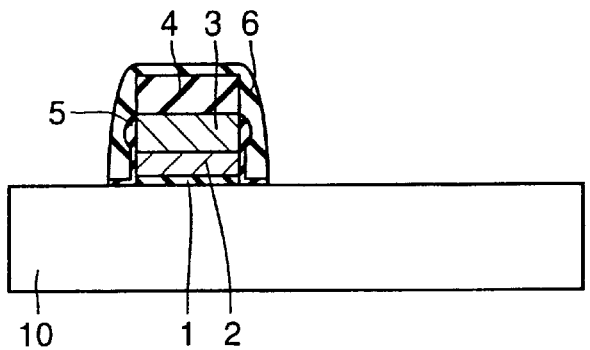
FIGS. 52 to 54 are cross section views showing the first to the third steps of the production process for a semiconductor device according to Embodiment 11 of the input present invention.

Next, an LDD (Lightly Doped Drain) structure is formed in order to prevent hot carriers from occurring due to an electric field concentration in the peripheral circuit part. At this time as shown in FIG. 52, for example a side wall isolation film is formed by the nitride film 6 and by using this an LDD structure is formed.

Figure 7:
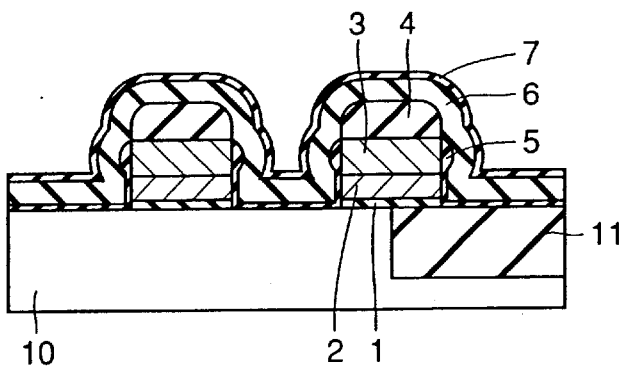

Next, a silicon oxide film 7 is formed for the purpose of active region protection of the peripheral circuit part. This silicon oxide film 7 is formed so as to cover the nitride film 6 as shown in FIG. 7 and the thickness of the silicon oxide film 7 is 10 nm to 20 nm.

Next, a silicon oxide film into which phosphorous and boron are doped and of which the filling in characteristics and evenness characteristics are excellent (BPTEOS (Boro Phospho Tetra Ethyl Ortho Silicate), PTEOS (Phospho Tetra Ethyl Ortho Silicate)) is deposited so as to fill in the silicon oxide film between the wires and a heat treatment is carried out in order to increase the evenness at each of the respective steps. As for the heat treatment, a dry reflow treatment (a heat treatment in an $O_2$ atmosphere) is carried out at a temperature of 800° C.–950° C. in order not to oxidize the substrate.

Figure 8:
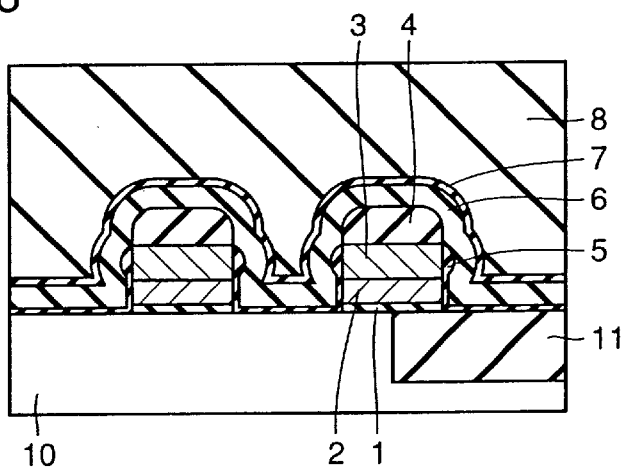

Thereby, as shown in FIG. 8 an interlayer oxide film 8 which becomes an interlayer insulation film is formed. The thickness of this interlayer oxide film 8 is 300 nm to 1000 nm. At this time as shown in FIG. 8, since the upper edge corner parts of the nitride film 4 and the nitride film 6 are rounded, the areas of the upper surface opening parts between the neighboring wires can be increased in comparison to the case wherein the upper edge corner parts are not rounded. That is to say, the width between the wires are broadened so that the interlayer oxide film 8 becomes easier to be filled in between the wires.

Figure 61:
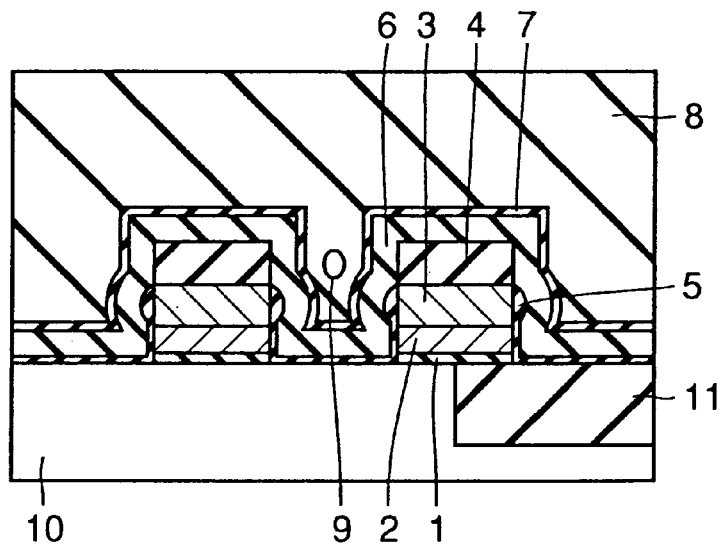
FIG. 61 is a cross section view of a semiconductor device according to a prior art.
Figure 62:
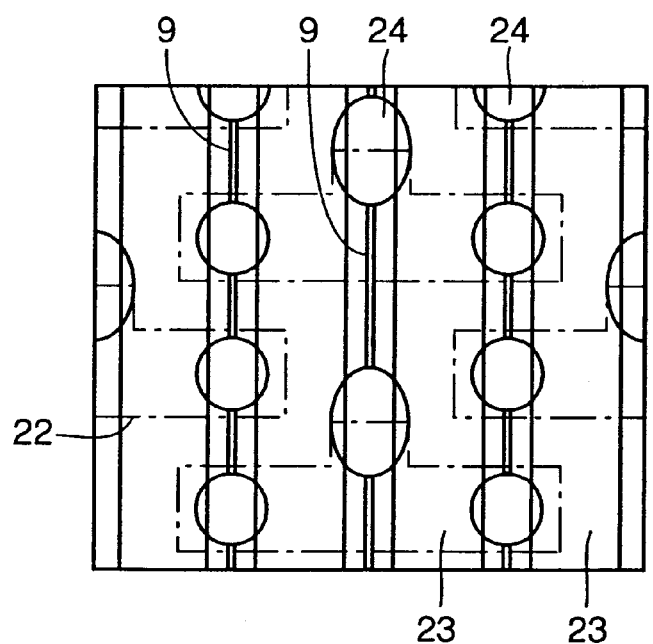
FIG. 62 is a plan view for describing a problem of semiconductor device according to a prior art.

As a result a void 9 as shown in FIG. 61 can be effectively prevented from being formed in the interlayer oxide film 8 so as to make possible the prevention, as described below, of short circuiting between the plug parts (first effect of the present invention).

It also becomes unnecessary to introduce a new device as a measure against the defective fillings and therefore the cost is reduced (second effect of the present invention). Furthermore, the temperature for a heat treatment carried out to increase the filling in characteristics can be lower than in a prior art so as to prevent the deterioration of the short channel characteristics of the transistors (sixth effect of the present invention).

On the other hand, in the case that the peripheral circuit part is exposed at the time of forming the interlayer oxide film 8, phosphorous or boron in the interlayer oxide film 8 diffuse into the active regions so as to give a negative influence to the transistor characteristics. However, since the above described silicon oxide film 7 is formed in the peripheral circuit part, this problem is solved.

Figure 9:
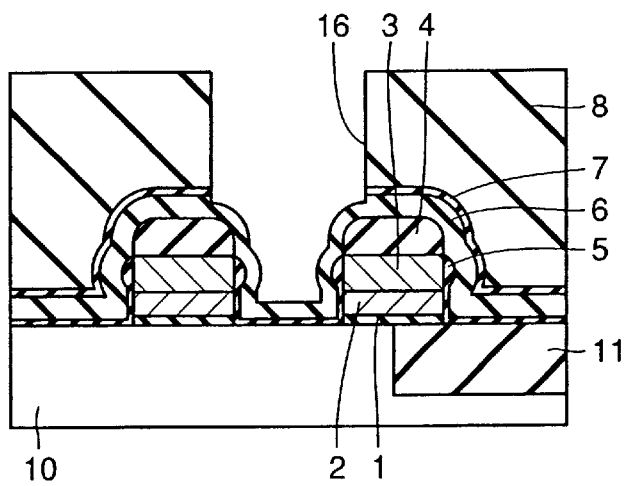

Next, as shown in FIG. 9 an opening 16 is formed in the interlayer oxide film 8 through dry etching such as by an RIE method or the like using a photoresist mask. At this time, by carrying out etching with a high selection ratio to the nitride film 6, it becomes possible to stop the etching within the nitride film 6, which is a protective film of the wires.

Figure 10:
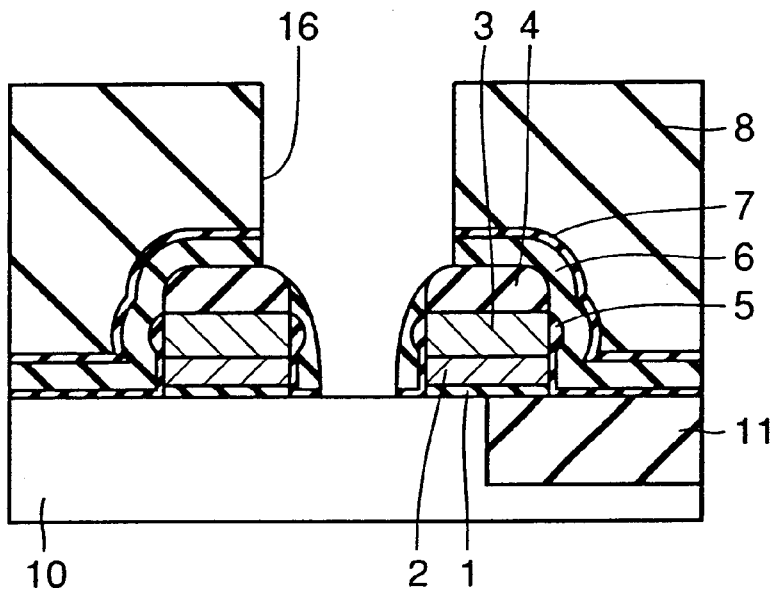

Next, the nitride film 6 on the bottom of the opening 16 is removed through dry etching such as by the RIE method. Thereby, as shown in FIG. 10, a contact hole reaching the semiconductor substrate 10 is formed.

Figure 11:
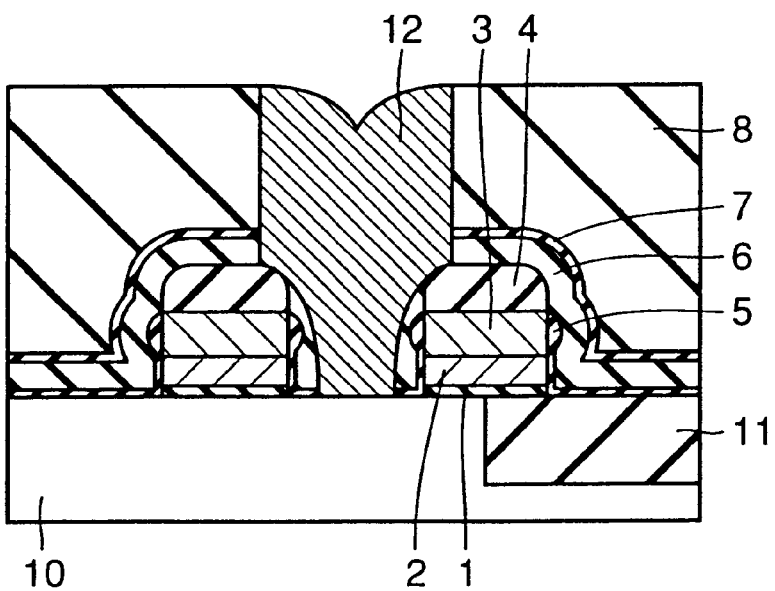
Figure 12:
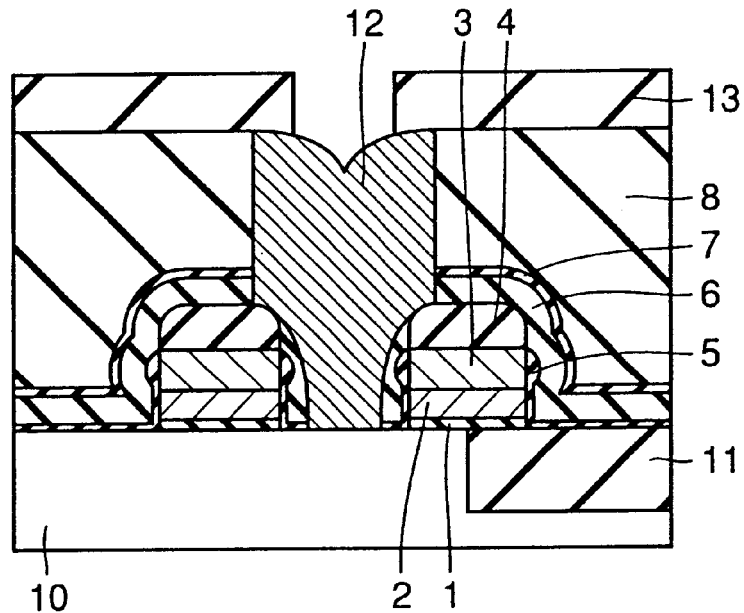

Next, a silicon film is deposited by a CVD method and dry etching such as by the RIE method is carried out on this silicon film. Thereby, as shown in FIG. 11 a plug part 12 is formed. The silicon film is formed of a polycrystal silicon film or an amorphous silicon film and an impurity such as P, As or the like is doped in the silicon film. The thickness of this silicon film is 100 nm to 400 nm.

Next, the silicon oxide film 13 is deposited by a CVD method under reduced pressure or under normal pressure and an opening (bit line contact part) is formed above the plug part 12. The silicon oxide film 13 may be a non-doped silicon oxide film or may be a silicon oxide film into which phosphorous or boron is doped. The thickness of the silicon oxide film 13 is 100 nm to 500 nm.

Figure 13:
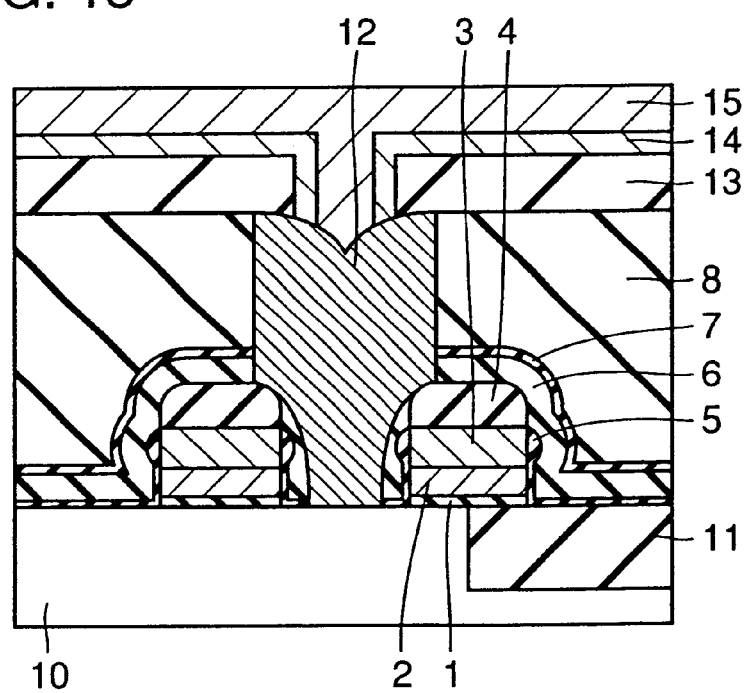

Next, as shown in FIG. 13, metal films 14 and 15 are deposited and a bit line is formed by carrying out dry etching such as by an RIE method using a photoresist mask. The metal film 14 is a barrier metal such as Ti, TiN or the like and the thickness of the metal film 14 is 20 nm to 100 nm. The metal film 15 is formed by a silicide film of high melting point metal such as W, a metal film such as W or Al or a multi-layered film thereof and the thickness of the metal film 15 is 50 nm to 200 nm.

Figure 14:
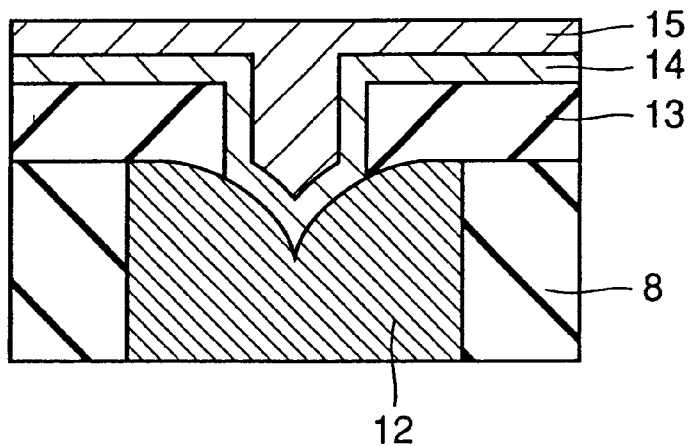
FIG. 14 is an expanded view of a bit line contact part in FIG. 13.

At this time, since the plug part 12 has a shape where the center part on the top is recessed, the contact area between the plug part 12 and the bit line increases. Thereby, the contact resistance (pad contact resistance) between the plug part 12 and the bit line becomes reduced. Thereby, the driving ability of the transistor increases (third effect of the present invention). Here, FIG. 14 shows an expanded view of the bit line contact part.

Figure 16:
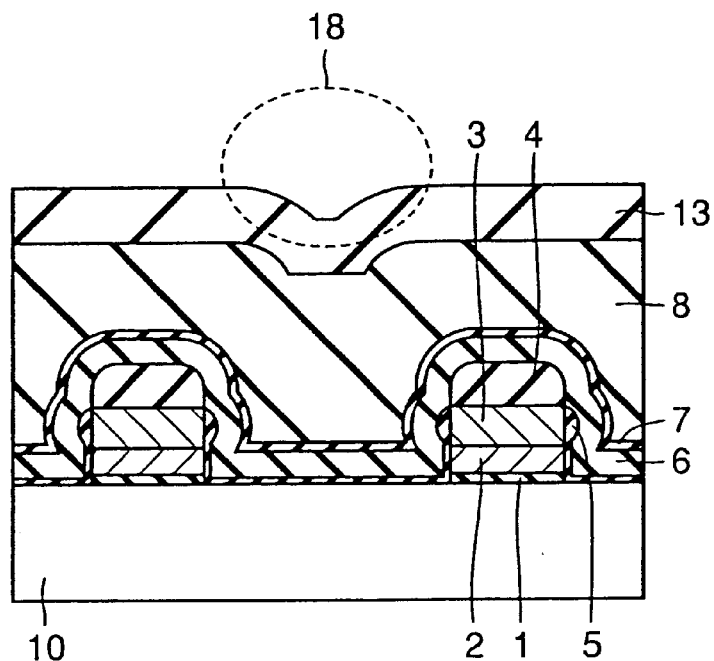
FIG. 16 is a view showing a cross section corresponding to FIG. 15 of the semiconductor device according to Embodiment 1 of the present invention.

In addition, in the peripheral circuit part, since the upper edge corner parts of the nitride films 4 and 6 are rounded as shown in FIG. 16, the steps of the surface of the interlayer oxide film 8 located between the wires become gentle. Thereby, it becomes possible to reduce costs by controlling the dimension fluctuation due to halation at the time of a photolithography process and by eliminating the anti-reflection coating (ARC) and to reduce the dimension fluctuation due to etching loss (fifth effect of the present invention).

Figure 15:
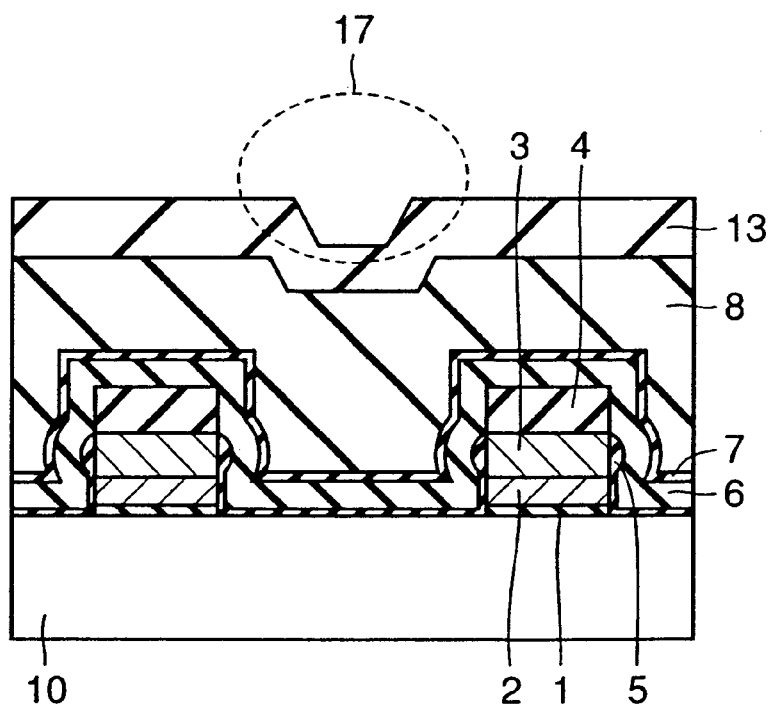
FIG. 15 is a section view of a semiconductor device according to a prior art.

FIG. 15 shows a conventional structure corresponding FIG. 16. By comparing those figures it is understood that the step in the region 17 of FIG. 15 is steeper than the step in the region 18 of FIG. 16.

Figure 18:
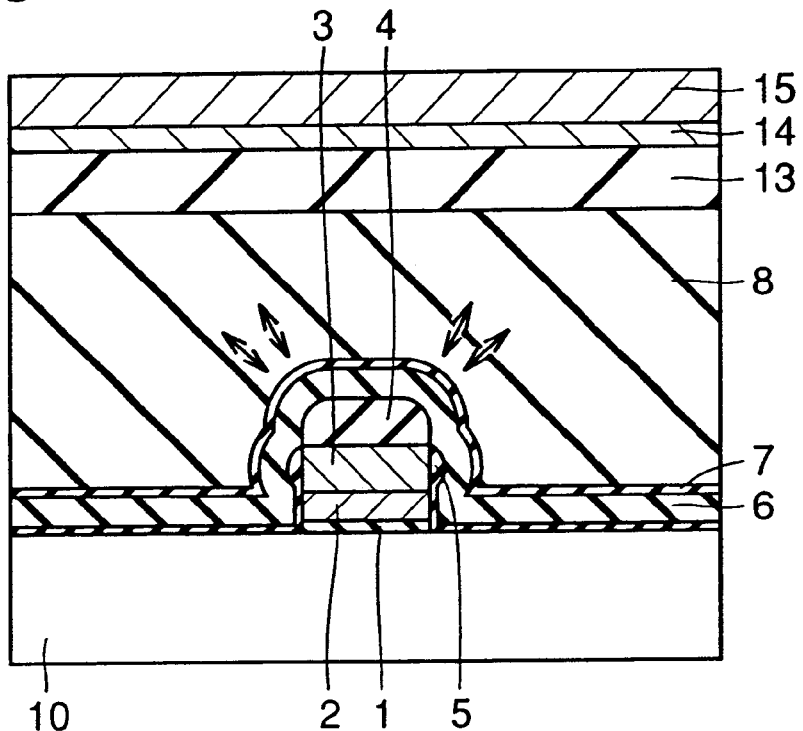
FIG. 18 is a view showing a section corresponding to FIG. 17 of the semiconductor device according to Embodiment 1 of the present invention.

In addition, since the upper edge corner parts of the nitride films 4 and 6 are rounded as shown in FIG. 18, the stress of the upper layer of the interlayer oxide film 8 or the like can be prevented from concentrating on the upper edge corner parts of the nitride films 4 and 6. Thereby, peeling in the vicinity of the upper edge corner parts of the nitride films 4 and 6 can be effectively limited (fourth effect of the present invention).

Figure 17:
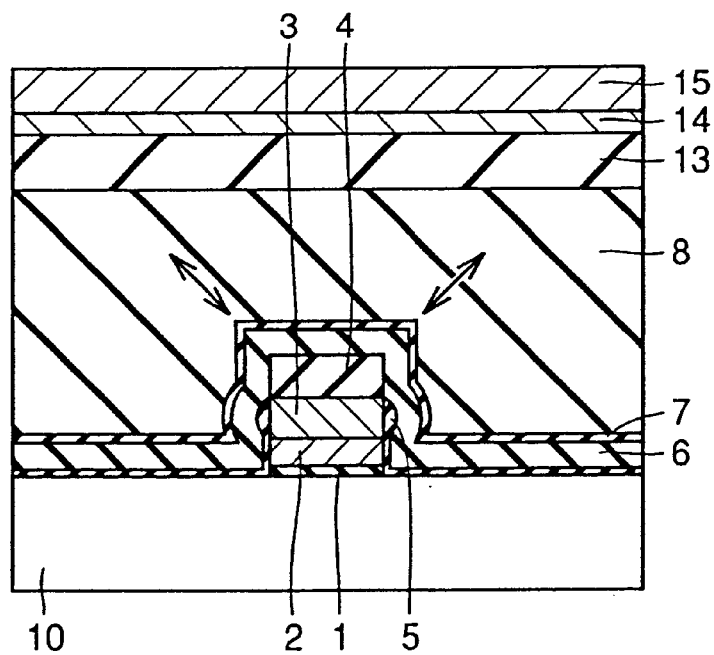
FIG. 17 is a section view of a semiconductor device according to a prior art.

FIG. 17 shows a conventional structure corresponding to FIG. 18. By comparing those figures, squared parts exist on the upper edge of the nitride films 4 and 6 in a conventional structure as shown in FIG. 17, the stress of the above layer concentrates into the vicinity of those squared parts.

(Embodiment 2)

Figure 19:
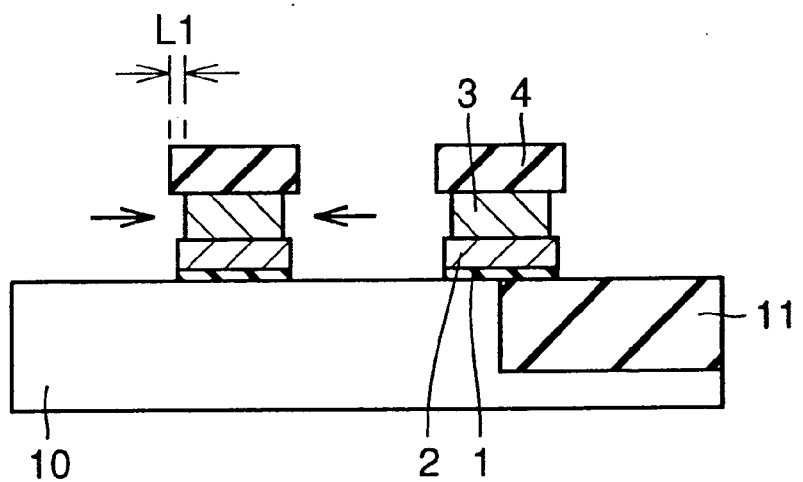
FIGS. 19 to 21 are cross section views showing the first to the third steps of a production process for a semiconductor device according to Embodiment 2 of the present invention.
Figure 20:
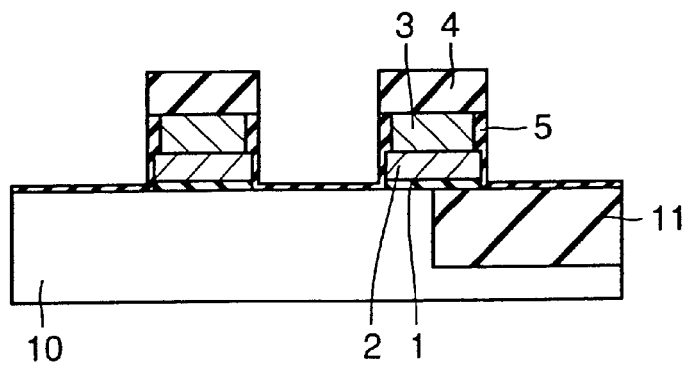
Figure 21:
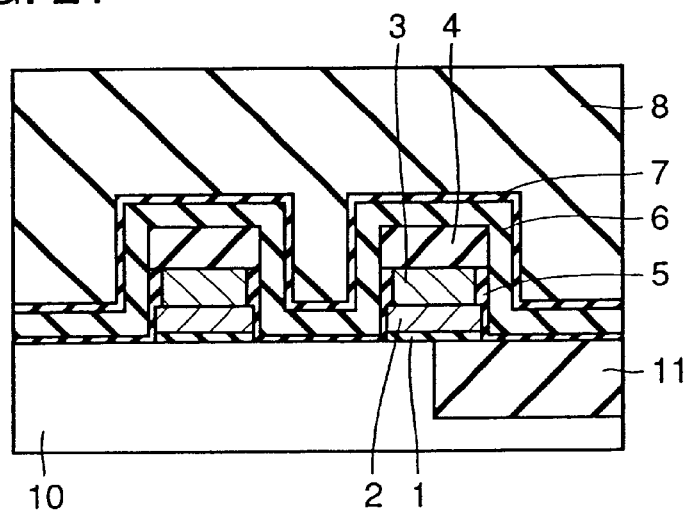

Next, Embodiment 2 of the present invention is described in reference to FIGS. 19 to 21. FIGS. 19 to 21 are views showing each of the production processes for a semiconductor device according to the present Embodiment 2.

In the present Embodiment 2 it is an important characteristic that the wire side walls in the self-alignment contact structure are in a flat or straight form.

First, a structure as shown in FIG. 2 is gained through the same steps as in Embodiment 1. Afterwards, through a wet treatment using ammonia water, the side walls of the silicide film 3 are etched. Thereby, the side walls of the silicide film 3 are set back by L1 (approximately 5 nm to 10 nm) from the side walls of the nitride film 4 or the silicon film 2 as shown in FIG. 19.

The above described set back amount L1 is ½ or more and ⅔ or less as thick as the silicon oxide film 5 formed on the side walls of the silicon film 2 in a later process.

Next, a silicon oxide film 5 is formed on the side walls of the wires in the same method as in Embodiment 1. At this time since the oxidation rate of the silicide film 3 is larger than the oxidation rate of silicon film 2, the thickness of the silicon oxide film 5 formed on the side walls of the silicide film 3 becomes larger than the thickness of the silicon oxide film 5 formed on the side walls of the silicon film 2 and, therefore, by setting back the side walls of the silicide film 3 in advance as described above, the surface of the silicon oxide film 5 can be made even.

Accordingly, the silicon oxide film 5 can be prevented from locally projecting to the side as in the case shown in FIG. 61 and, as a result, the surface of the silicon oxide film 5 extends in a substantially straight manner perpendicular to the main surface of the semiconductor substrate 10. Thereby, the defective fillings of the interlayer oxide film 8 can be prevented in comparison to a prior art wherein the silicon oxide film 5 locally projects to the side. As a result, short circuiting between the plug parts can be prevented.

In addition, according to Embodiment 2, in the same way as in the case of Embodiment 1, the first and sixth effects of the present invention can be gained.

(Embodiment 3)

Next, Embodiment 3 according to the present invention is described in reference to FIGS. 22 to 28. FIGS. 22 to 28 are the views showing respective production processes of a semiconductor device according to the present Embodiment 3.

The present Embodiment 3 has the important characteristics that the upper part of the nitride film is rounded by providing the nitride film surface with a gentle tapered shape located between the wires in a self-alignment contact structure.

Figure 22:
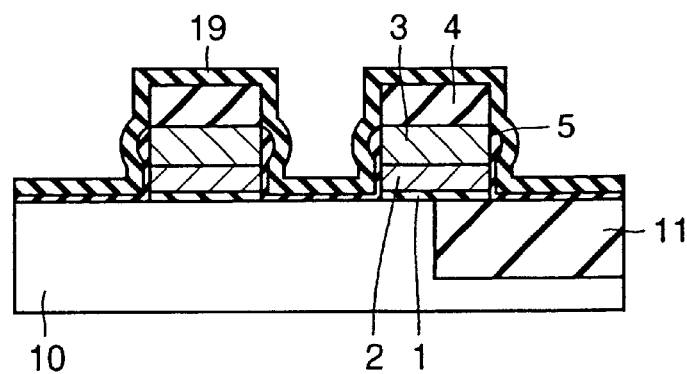
FIGS. 22 to 24 are cross section views showing the first to the third steps of a production process of a semiconductor device according to Embodiment 3 of the present invention.

First, a structure as shown in FIG. 2 is gained through the same steps as in Embodiment 1. Afterwards, the side walls of the wires are oxidized to form silicon oxide films 5. Next, as shown in FIG. 22 a silicon oxide film 19 is deposited by a CVD method. The thickness of the silicon oxide film 19 is 20 nm to 50 nm.

Figure 23:
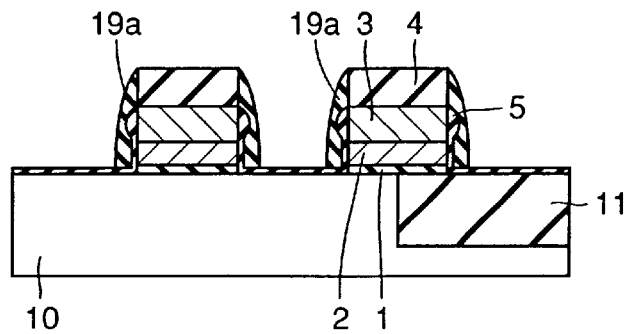
Figure 25:
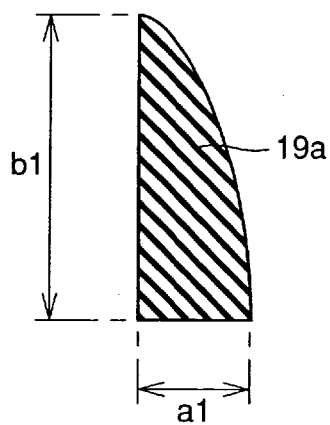
FIG. 25 is a view for describing the characteristics with respect to the shape of the side wall isolation film according to the present invention.

Next, as shown in FIG. 23 a side wall oxide film 19a is formed by etching back the silicon oxide film 19 through dry etching. FIG. 25 shows an expanded view of the side wall oxide film 19a.

As shown in FIG. 25, when the width of the bottom of the side wall oxide film 19a is denoted as a1 and the height is denoted as b1 then it is preferable for the width a1 and the height b1 to satisfy the relationship of 2<b1/a1<15.

In the same way as in Embodiment 1, a nitride film 6 and a silicon oxide film 7 are formed so as to cover the above described side wall oxide film 19a. At this time the surfaces of the nitride film 6 and the silicon oxide film 7 become a gentle tapered form as shown in FIG. 24 by forming a side wall oxide film 19a in the above described form.

Figure 24:
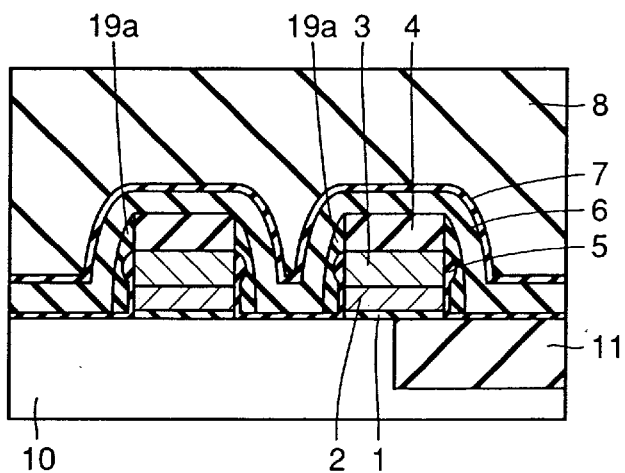

Afterwards, as shown in FIG. 24, an interlayer oxide film 8 is formed in the same way as in Embodiment 1. Since the surfaces of the nitride film 6 and the silicon oxide film 7 become a gentle tapered form as described above, the filling in characteristics of the interlayer oxide film 8 between the wires can be improved. Thereby, the first, the second and the sixth effects of the present invention can be gained.

Figure 26:
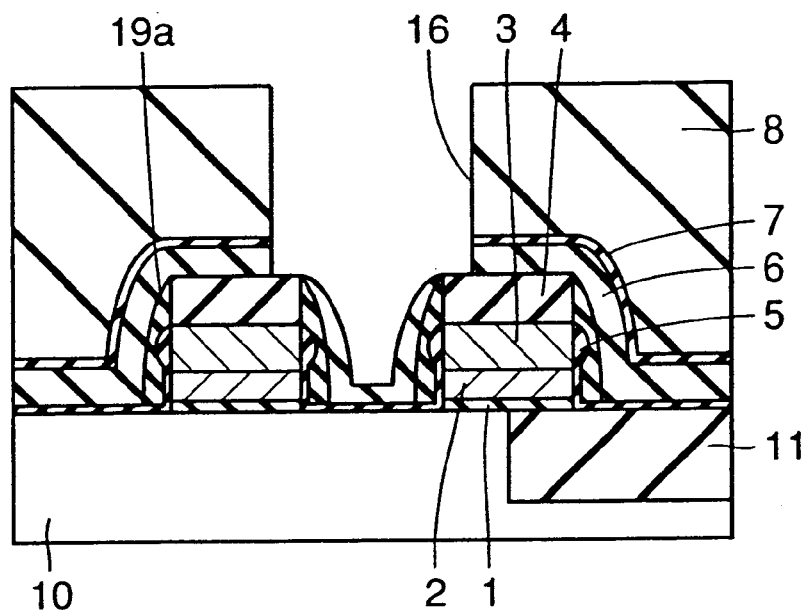
FIGS. 26 to 28 are section views showing the fourth to the sixth steps of the production process for a semiconductor device according to Embodiment 3 of the present invention.
Figure 27:
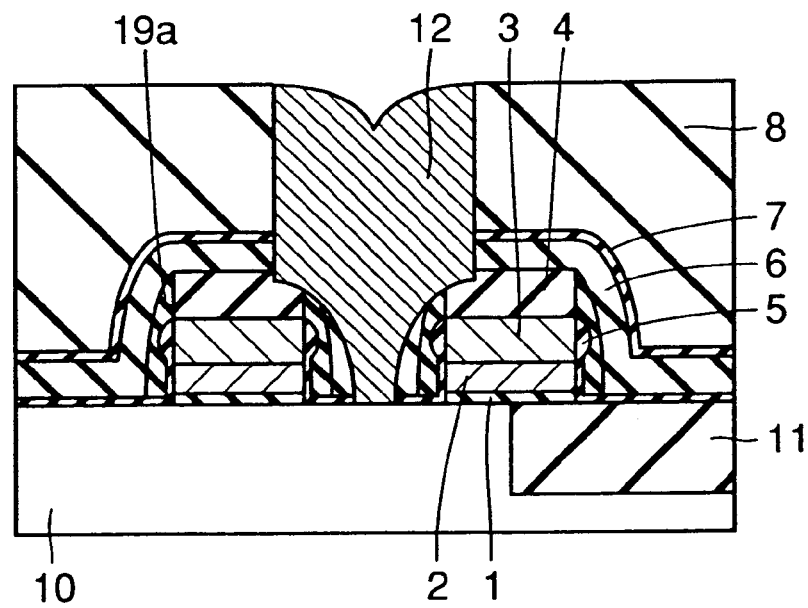
Figure 28:
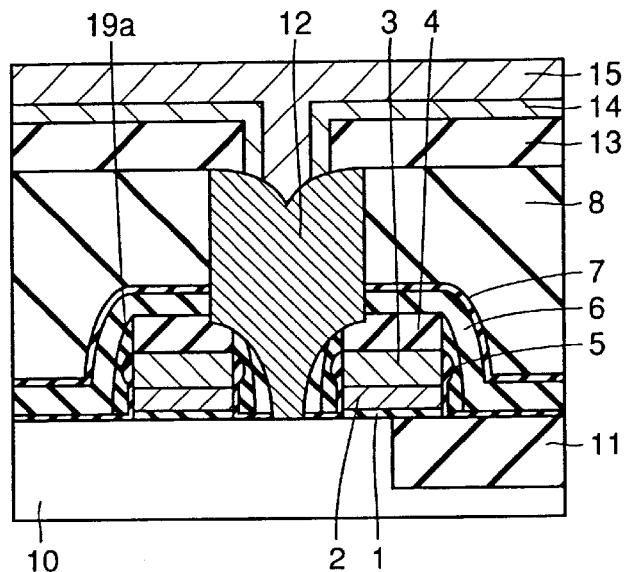

Next, in the same way as in Embodiment 1, an opening 16 is formed as shown in FIG. 26, a plug part 12 is formed as shown in FIG. 27, and a silicon oxide film 13 and metal films 14 and 15 are formed as shown in FIG. 28.

In the case of the present Embodiment, since the top of the plug part 12 is rounded, the third effect of the present invention can be gained. In addition, since the surface form of the nitride film 6 and the silicon oxide film 7 is in a gentle tapered form, the steps are not steep in the peripheral circuit part in the same way as in the case of FIG. 16 so that the fifth effect of the present invention can be gained. Furthermore, since the upper edge corner parts of the nitride film 6 and the silicon oxide film 7 form obtuse angles as a result the fourth effect of the present invention can also be gained in the same way as the case of FIG. 18.

(Embodiment 4)

Next, Embodiment 4 according to the present invention is described in reference to FIGS. 29 to 33. FIGS. 29 to 33 are the views showing respective production processes of semiconductor device according to the present Embodiment 4.

The present Embodiment 4 has the important characteristics that the upper part of the nitride film is rounded by making the nitride film in a self-alignment contact structure a side wall form.

Figure 29:
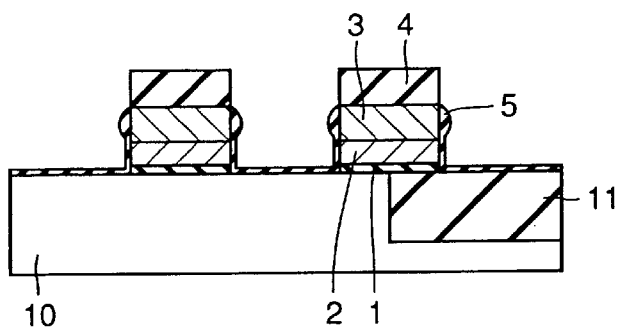
FIGS. 29 to 33 are cross section views showing the first to the fifth steps of the production process for a semiconductor device according to Embodiment 4 of the present invention.
Figure 30:
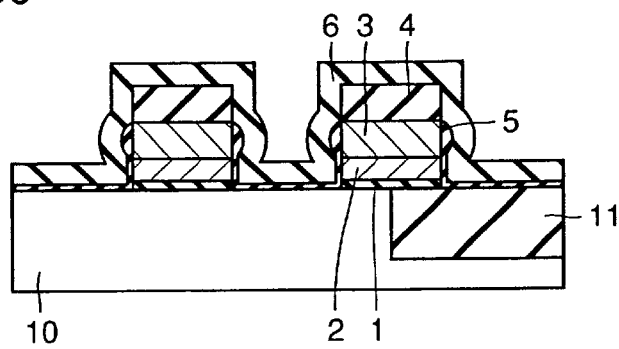
Figure 31:
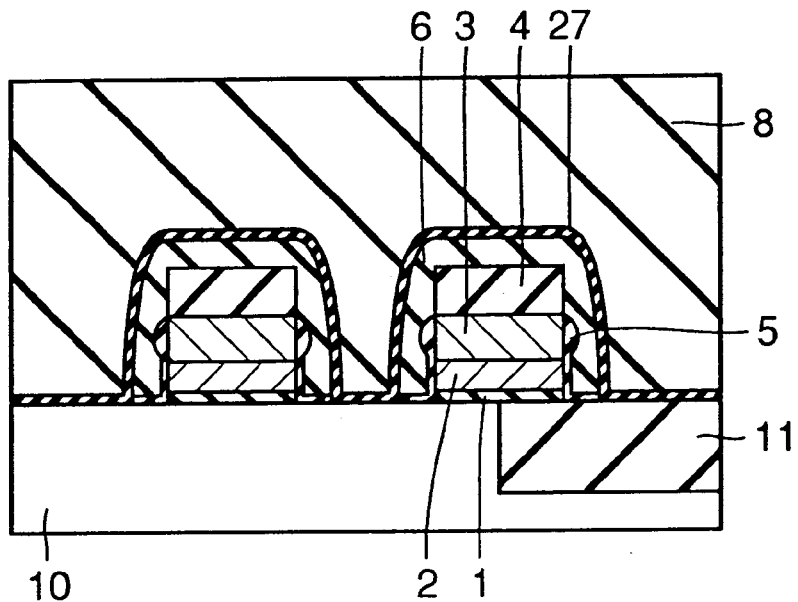

First, after gaining a structure as shown in FIG. 2 through the same steps as in Embodiment 1, silicon oxide films 5 are formed by oxidizing the side walls of the wires as shown in FIG. 29 and a nitride film 6 is deposited thereon as shown in FIG. 30. This nitride film 6 is etched back to form a side wall as shown in FIG. 31. The relationships between the width of the bottom and the height in the side wall isolation film formed in this way are the same as the case as shown in FIG. 25.

Next, a nitride film 27 is deposited by a CVD method so as to cover the nitride film 6. The thickness of the nitride film 27 is 10 nm to 20 nm. The nitride film 27 functions as a stopper film in the contact bottom at the time of self-alignment etching.

Next, an interlayer oxide film 8 is formed so as to cover the nitride film 27. Though the same method as in the case of each of the above described embodiments may be adopted as a method for forming the interlayer oxide film 8, a wet reflow process (heat treatment in a $H_2O$ atmosphere) under the temperature of 800° C. to 950° C. can be adopted in the case of the present embodiment. Thereby, the filling in characteristics can be improved further.

Since the surfaces of the nitride film 6 and the nitride film 27 can also be made into a gentle tapered form in the case of the present embodiment as shown in FIG. 31, the first effect of present invention can be gained. And since it is not necessary to introduce a new device, the second effect of the present invention can be gained. In addition, the sixth effect of the present invention can be gained.

Figure 32:
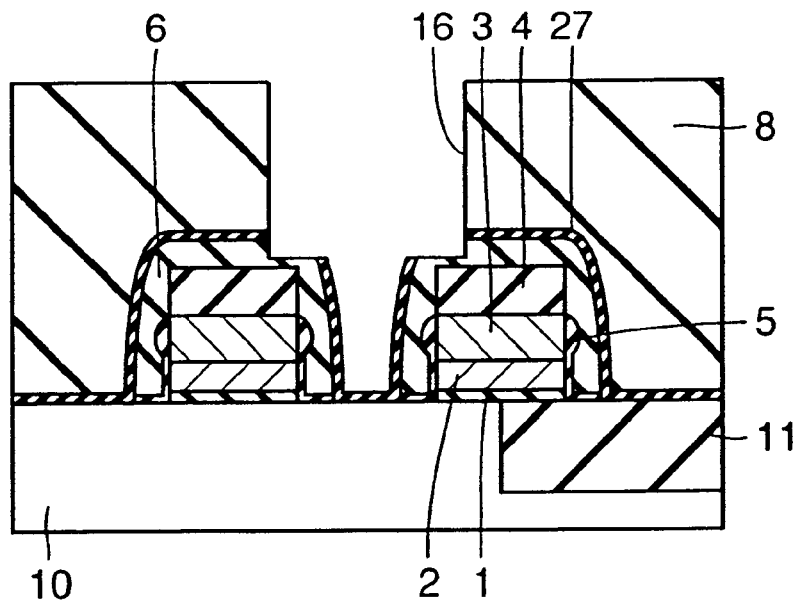

Next, an opening 16 is formed by a dry etching method such as an RIE method as shown in FIG. 32. At this time the etching can be stopped within the nitride film 6 and the semiconductor substrate 10 can be protected by carrying out etching, of which the selection ratio is large for the nitride film.

Next, the thin nitride film 27 on the semiconductor substrate 10 is removed by etching. At this time since the thickness of the nitride film 27 is small, the over etching amount of the semiconductor substrate 10 at the time of etching removal of the nitride film 27 can be reduced. Thereby, the damage to the semiconductor substrate 10 can be reduced so that a leak current can be reduced. As a result the refresh characteristics are improved (seventh effect of the present invention).

Figure 33:
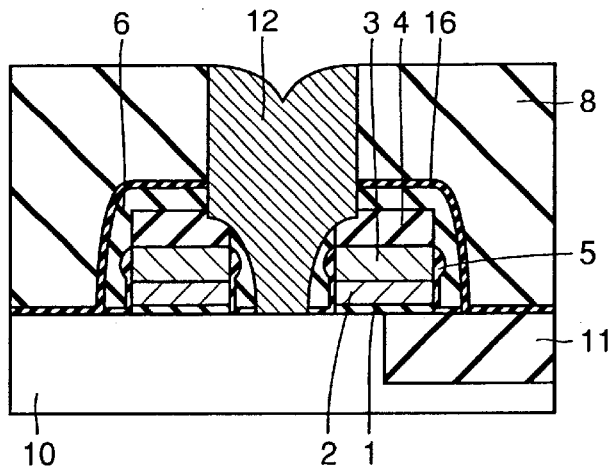

Afterwards, a plug part 12 is formed as shown in FIG. 33 in the same way as in Embodiment 1. Afterwards, a silicon oxide film 13, a metal film 14 and a metal film 15 are formed.

In the case of the present embodiment, since the top of the plug part 12 is rounded the third effect of the present invention can be gained. In addition, since the surface form of the nitride films 6 and 27 is in a gentle tapered form, the steps are not steep in the peripheral circuit part in the same way as the case of FIG. 16 so that the fifth effect of the present invention can be gained. In addition, since the upper edge corner parts of the nitride film 6 and the nitride film 27 form obtuse angles as a result, the fourth effect of the present invention can be gained in the same way as in the case of FIG. 18.

(Embodiment 5)

Figure 38:
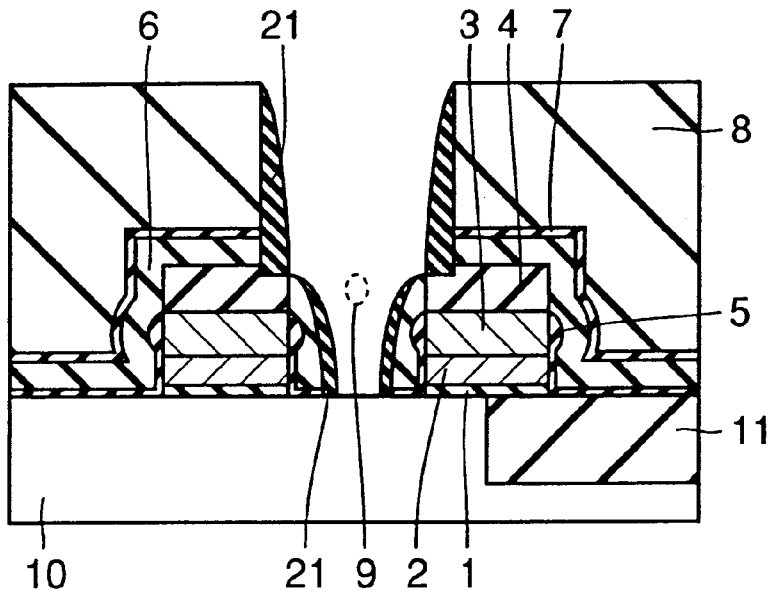
Figure 39:
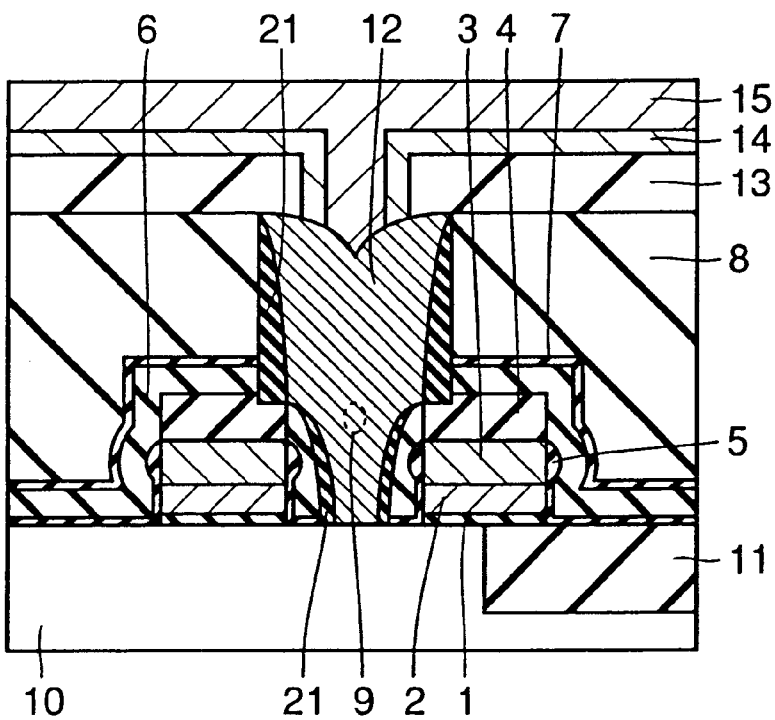
Figure 40:
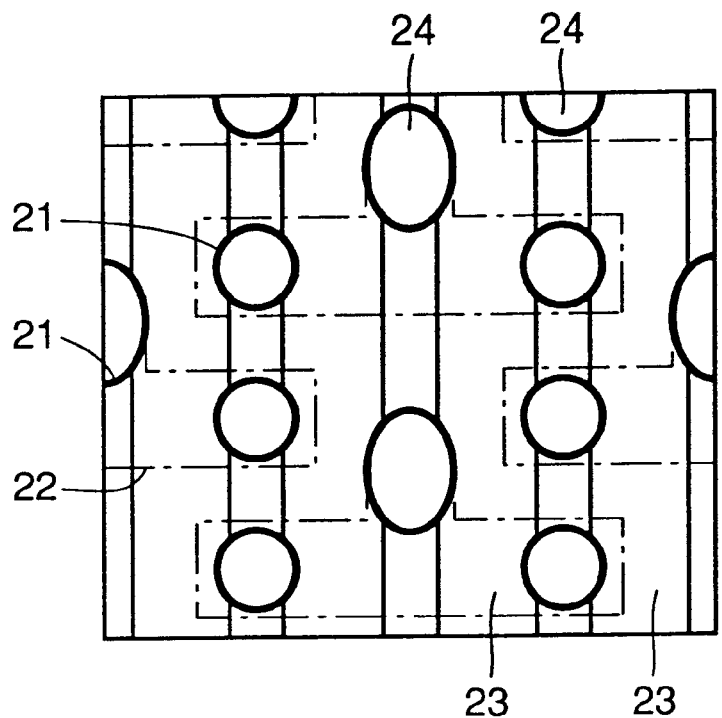
FIG. 40 is a plan view showing the characteristics of the semiconductor device according to Embodiment 5 of the present invention.

Next, Embodiment 5 according to the present invention is described in reference to FIGS. 34 to 40. FIGS. 34 to 39 are the views showing respective production processes of a semiconductor device according to the present Embodiment 5. FIG. 40 is a plan view of a semiconductor device according to the present Embodiment 5.

The present Embodiment 5 has the important characteristics that a side wall isolation film is formed as a protective film on the side walls of openings after the openings are formed by a self-alignment method.

Figure 34:
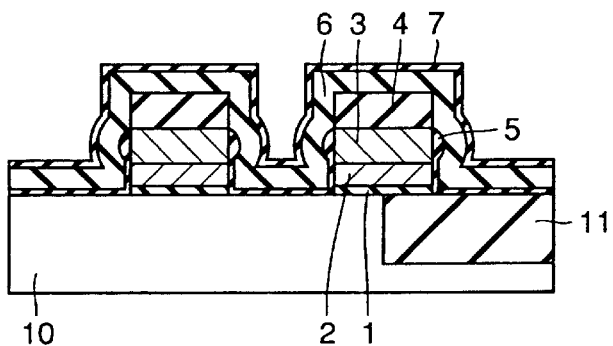
FIGS. 34 to 39 are cross section views showing the first to the sixth steps of the production process for a semiconductor device according to Embodiment 5 of the present invention.

After generating a structure as shown in FIG. 2 through the same steps as in Embodiment 1 first, silicon oxide films 5 are formed by oxidizing the side walls of the wires as shown in FIG. 34 and then a nitride film 6 and a silicon oxide film 7 are deposited thereon.

Figure 35:
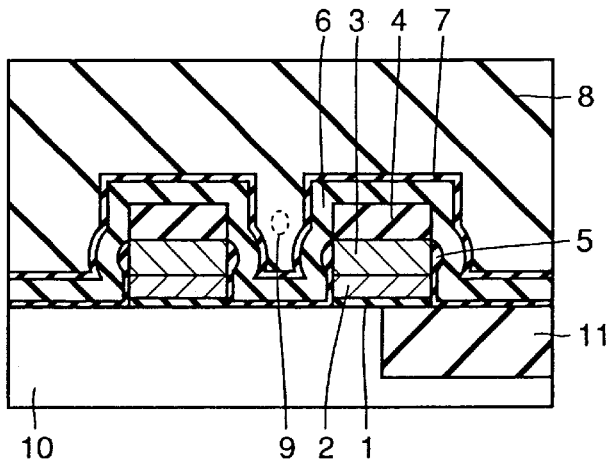

Next, an interlayer oxide film 8 is formed so as to cover the silicon oxide film 7 as shown in FIG. 35. As for the method for forming the interlayer oxide film 8 the same method is adopted as in the case in Embodiment 1. Since the silicon oxide films 5 project to the side at this time and the upper edge corner parts of the nitride film 6 and the silicon oxide film 7 are square, a void 9 can be formed as shown in FIG. 35.

Figure 36:
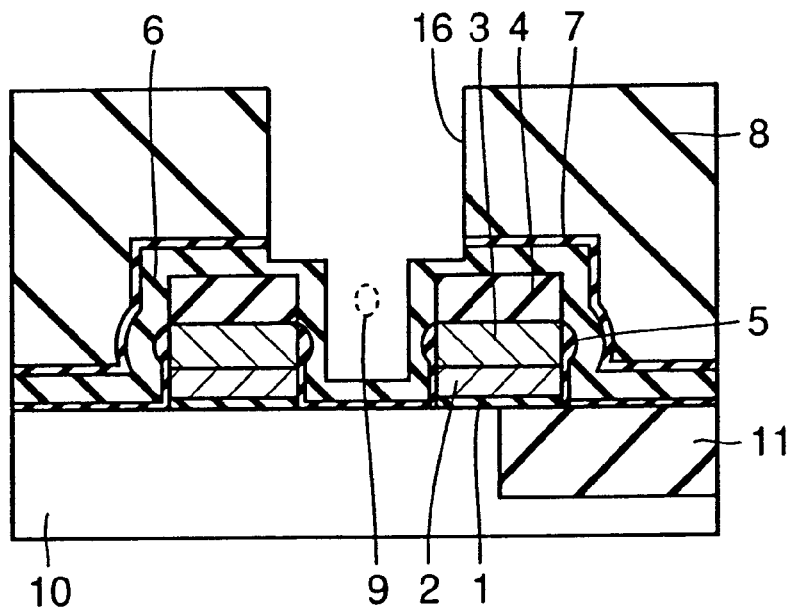
Figure 37:
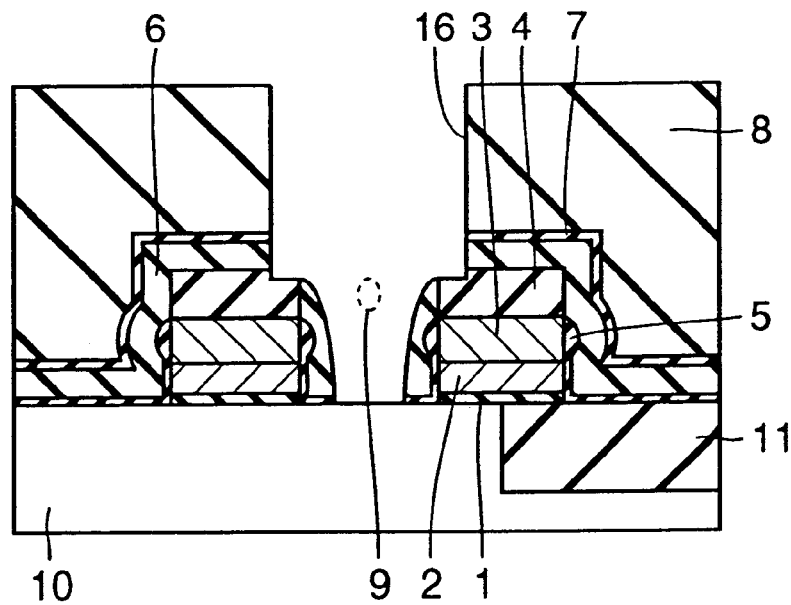

Next, an opening 16 is formed by selectively etching the interlayer oxide film 8 as shown in FIGS. 36 and 37. Next, a protective film 21 is deposited on the surface within the opening 16 and on the interlayer oxide film 8. The protective film 21 is an isolation film such as a nitride film or silicon oxide film and the thickness of the protective film 21 is 10 nm to 20 nm.

The protective film 21 is etched back to form a side wall as shown in FIG. 38. In this case side wall isolation films are formed respectively on the side walls of the interlayer oxide film 8 and on the nitride film 6. The relationships between the width of the bottom and the height in those side wall isolation films are the same as the case shown in FIG. 25.

Next, a plug part 12 is formed within a region surrounded by the protective film 21 in the same way as in Embodiment 1 as shown in FIG. 39. Thereby, the contact part 24 can be surrounded by the protective film 21 as shown in FIG. 40. As a result, electrical connection between the plug part 12 and a conductive material within the void 9 can be prevented even in the case that a conductive material infiltrates into the void 9 at the time of forming the plug part 12 and, therefore, short circuiting between the plug parts can be limited.

Next, a silicon oxide film 13, a metal film 14 and a metal film 15 are formed on the interlayer oxide film 8 in the same way as in Embodiment 1 as shown in FIG. 39.

The second and the sixth effects of the present invention can also be gained according to the present embodiment.

(Embodiment 6)

Figure 41:
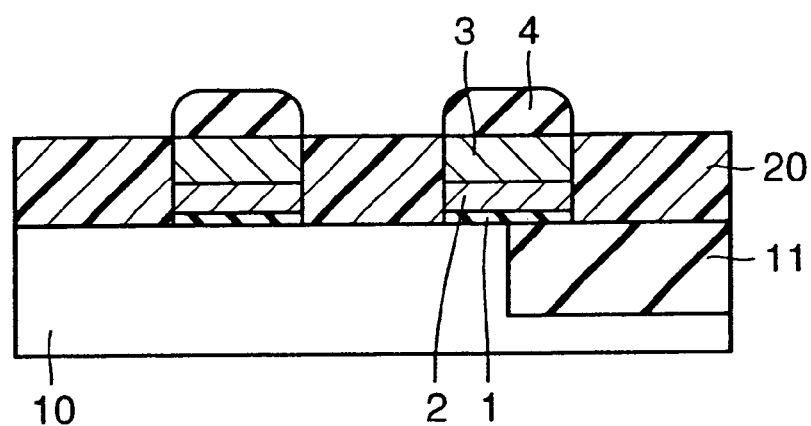
FIG. 41 is a cross section view showing a characteristic production process for a semiconductor device according to Embodiment 6 of the present invention.

Next, Embodiment 6 according to the present invention is described in reference to FIG. 41. FIG. 41 is a view showing characteristic production processes for a semiconductor device according to the present Embodiment 6.

The present Embodiment 6 is an example of a modification of Embodiment 1, which has the important characteristics that the upper edge corner parts of the nitride film are rounded by using a photoresist.

First, a structure as shown in FIG. 2 is generated through the same steps as in Embodiment 1. Afterwards, a photoresist 20 is applied, a half exposure is carried out and development is carried out. Thereby, the upper part of the photoresist 20 is removed so as to be in the condition where the photoresist 20 is filled in between the wires. Under this condition the upper edge corner parts of the nitride film 4 are rounded as shown in FIG. 41 in the same method as in Embodiment 1.

Thereby, the upper edge corner parts of the nitride film 4 can be rounded while protecting the side walls of the wires. Afterwards, the photoresist 20 is removed by dry etching or wet etching. After that a semiconductor device according to the present embodiment is formed through the same steps as in Embodiment 1.

(Embodiment 7)

Next, Embodiment 7 according to the present invention is described in reference to FIGS. 42 to 45. FIGS. 42 to 45 are the views showing the respective production processes for a semiconductor device in the present Embodiment 7.

Important characteristics of the present Embodiment 7 are that the upper edge corner parts of the nitride film which covers the hard mask film in a self-alignment contact structure are in a rounded form and the gap between the upper edge parts of the wires is broadened.

Figure 42:
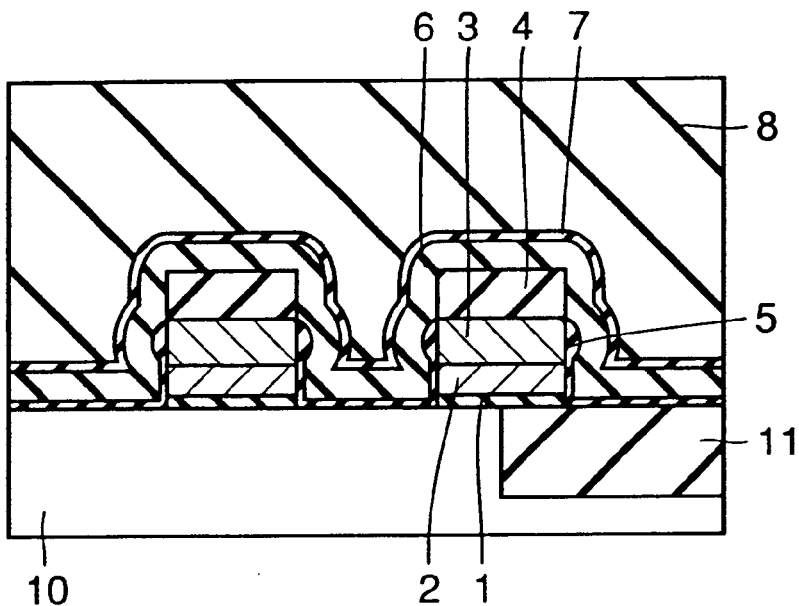
FIG. 42 is a cross section view showing the first step of the production process for a semiconductor device according to Embodiment 7 of the present invention.

First, a structure as shown in FIG. 2 is gained through the same steps as in Embodiment 1. Afterwards, silicon oxide films 5 are formed by oxidizing the side walls of the wires as shown in FIG. 42 and a nitride film 6 is deposited thereon. Then, the upper edge corner parts of the nitride film 6 are rounded in the same method as in Embodiment 1.

Figure 43:
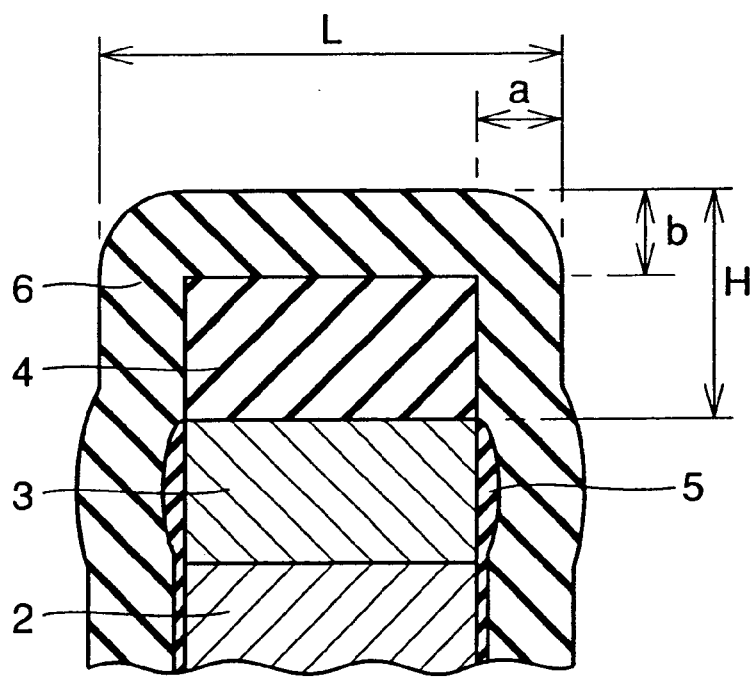
FIG. 43 is a cross section view of the expanded upper part of the nitride film in FIG. 42.

FIG. 43 shows an expanded figure of the nitride film 6 of which the upper edge corner parts are rounded. As shown in FIG. 43 when the width of the nitride film 6 located on the nitride film (hard mask film) 4 is denoted as L, the height of the nitride film 4 from the bottom is denoted as H, the width of the rounded parts is denoted as a and the height is denoted as b, the ranges of the width a and the height b are represented by $0<a<L/2$ and $0<b<H$. More preferably they are $a \geq L/4$ and $b \geq H/2$.

Next, a silicon oxide film 7 is formed so as to cover the nitride film 6 by the same method as in Embodiment 1 as shown in FIG. 42, and an interlayer oxide film 8 is formed so as to cover the silicon oxide film 7.

At this time, since the upper edge corner parts of the nitride film 6 are rounded, the opening areas between the upper edge parts of the wires can be increased so that the defective fillings of the interlayer oxide film 8 between the wires can be limited in the same way as in Embodiment 1. Thereby, the first effect of the present invention can be gained. And the second and the sixth effects of the present invention can also be gained.

Figure 44:
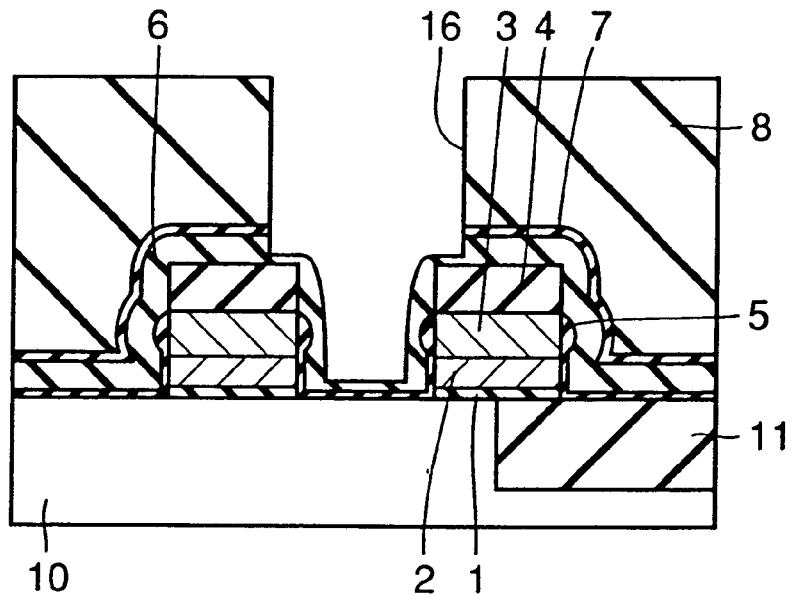
FIGS. 44 and 45 are cross section views showing the second and the third steps of the production process for a semiconductor device according to Embodiment 7 of the present invention.
Figure 45:
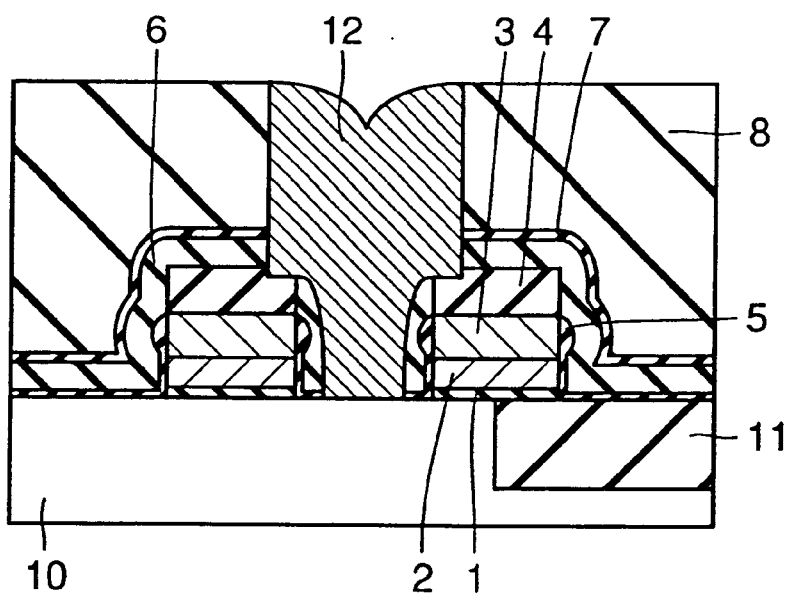

Next, an opening 16 is formed by the same method as in Embodiment 1 as shown in FIG. 44 and a plug part 12 is formed as shown in FIG. 45. Afterwards, a silicon oxide film 13, a metal film 14 and a metal film 15 are formed on the interlayer oxide film 8 by the same method as in Embodiment 1.

In the case of the present embodiment the plug part 12 becomes recessed on the top as shown in FIG. 45 and, therefore, the third effect of the present invention can be gained. Since the upper part of the nitride film 6 becomes the same form as in the case of Embodiment 1, the fourth and the fifth effects of the present invention can also, as a result, be gained.

(Embodiment 8)

Figure 46:
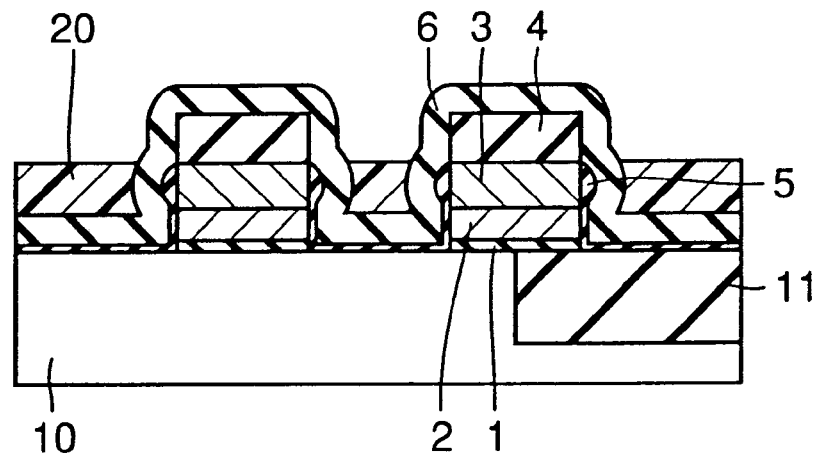
FIG. 46 is a cross section view showing a characteristic production process for a semiconductor device according to Embodiment 8 of the present invention.

Next, Embodiment 8 according to the present invention is described in reference to FIG. 46. FIG. 46 is a view showing characteristic production processes of a semiconductor device according to the present Embodiment 8.

The present Embodiment 8 is an example of a variation of Embodiment 7, which has the important characteristics that the upper edge corner parts of the nitride film are rounded by using photoresist.

First, a nitride film 6 is formed through the same steps as in Embodiment 7. Afterwards, a photoresist 20 is applied, a half exposure is carried out and development is carried out. Thereby the top part of the photoresist 20 is removed so as to be a condition where the photoresist 20 is filled in between the wires. That is to say, the nitride film 6 located between the wires can be covered with the photoresist 20. Under this condition the upper edge corner parts of the nitride film 6 are rounded as shown in FIG. 46 by the same method as in Embodiment 1.

Thereby, the upper edge corner parts of the nitride film 4 can be rounded while protecting the nitride film 6 located between the wires with the photoresist 20 so that the nitride film 6 can, without fail, remain between the wires. Afterwards, the photoresist 20 is removed by dry etching or wet etching. After that a semiconductor device according to the present embodiment is formed through the same steps as in Embodiment 7.

(Embodiment 9)

Figure 47:
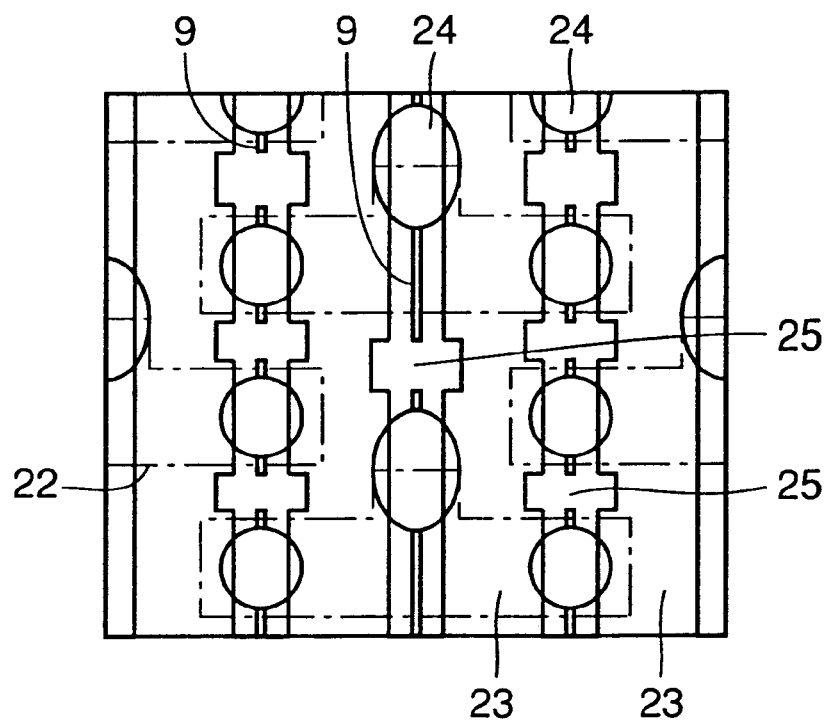
FIG. 47 is a plan view of a part showing the characteristics of the semiconductor device according to Embodiment 9 of the present invention.
Figure 48:
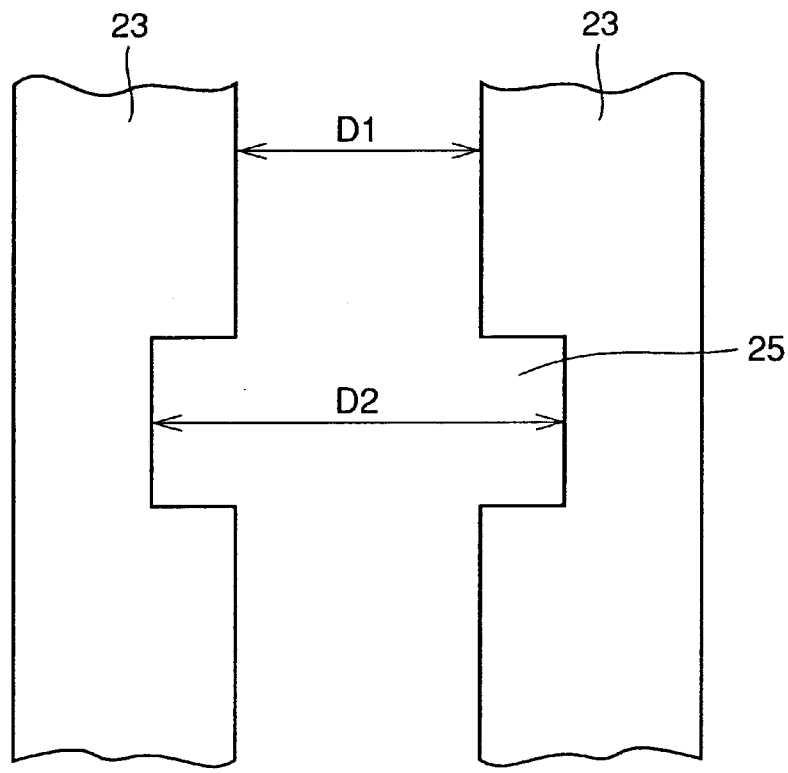
FIG. 48 is an expanded view of a part of the semiconductor device as shown in FIG. 47.

Next, Embodiment 9 according to the present invention is described in reference to FIGS. 47 and 48. FIG. 47 is a plan view of semiconductor device according to the present Embodiment 9 and FIG. 48 a partially expanded view of FIG. 47.

Important characteristics of the present Embodiment 9 are that the defective fillings of the interlayer oxide film can be limited by locally broadening the gap between the wires on isolation regions so that the aspect ratio of the regions between the wires with respect to those parts is made small.

As shown in FIG. 47 the width of the region 25 between the wires 23 located on the isolation region is larger than the width of the other regions between the wires 23. Thereby, the aspect ratio of the region 25 becomes small so as to be able to limit the defective fillings of the interlayer oxide film 8.

An expanded view in the vicinity of region 25 is shown in FIG. 48. The gap D1 between the wires 23 other than the region 25 is 0.1 µm to 0.3 µm and the gap D2 between the wires 23 in the region 25 is preferably 1.2 times or more and 2.0 times or less as large as the gap D1. Thereby, the defective fillings of the interlayer oxide film 8 in the region 25 can be effectively limited and the occurrence of the void 9 in the region 25 can be limited as shown in FIG. 47.

As a result short circuits between the contact parts 24 due to the fact that a conductive material is filled in into the void 9 can be prevented so that the first effect of the present invention can be gained. The second and the sixth effects of the present invention can also be gained.

A sectional structure of a semiconductor device according to the present embodiment is not shown since it is the same as each of the other embodiments and a nitride film (hard mask film) 4, a nitride film 6, a silicon oxide film 7, an interlayer oxide film 8 or the like are formed on the wires 23.

(Embodiment 10)

Figure 49:
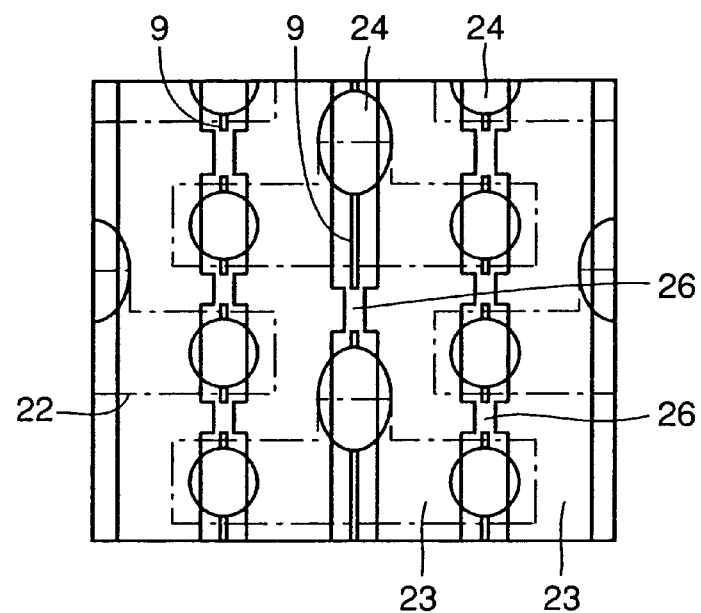
FIG. 49 is a plan view showing the characteristics of the semiconductor device in Embodiment 10 of the present invention.
Figure 50:
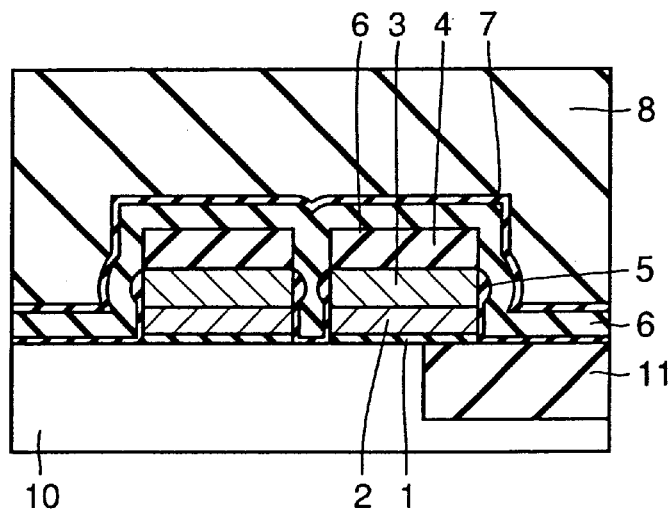
FIG. 50 is a cross section view of a part of the semiconductor device in FIG. 49.
Figure 51:
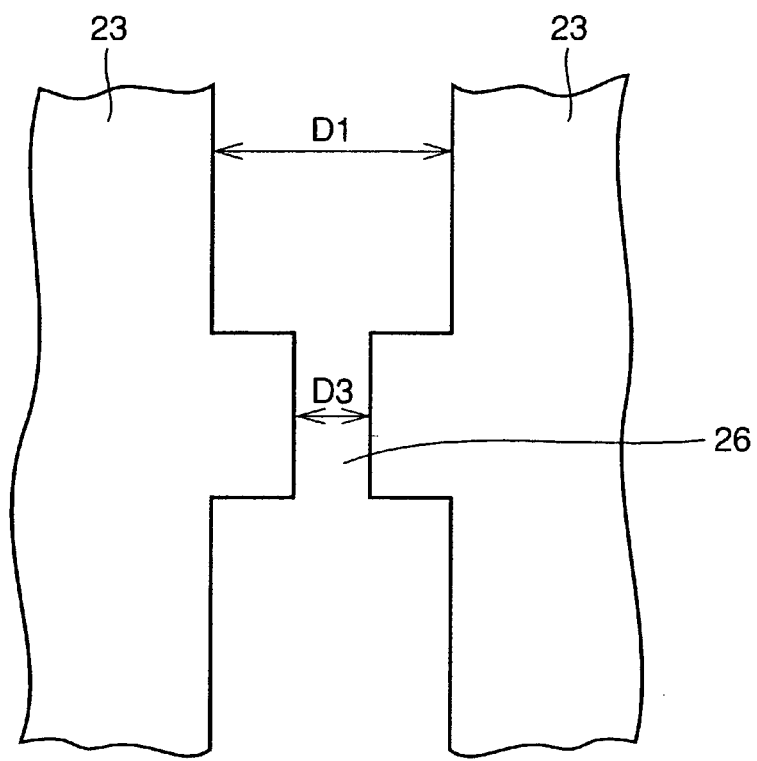
FIG. 51 is an expanded view of a part of the semiconductor device in FIG. 49.

Next, Embodiment 10 according to the present invention is described in reference to FIGS. 49 to 51. FIG. 49 is a plan view of a semiconductor device according to the present embodiment, FIG. 50 is a section view in the vicinity of the region 26 of FIG. 49 and FIG. 51 is a partially expanded view of FIG. 49.

Important characteristics of the present Embodiment 10 are that by making the gap between the wires on isolation regions locally narrow so that a nitride film is filled in into the regions between the wires in that part, an interlayer oxide film is prevented from infiltrating into the regions so that, as a result the defective fillings of the interlayer oxide film can be limited.

As shown in FIG. 49 the width of the regions 26 between the wires 23 located on isolation regions is smaller than the width of the other regions between the wires 23. Thereby, the region 26 can be filled in with the nitride film 6 as shown in FIG. 50 so that an interlayer oxide film 8 can be prevented from infiltrating into the regions 26. As a result the defective fillings of the interlayer oxide film 8 in the region 26 can be limited.

An expanded figure in the vicinity of the region 26 is shown in FIG. 51. The gap D1 between the wires 23 in the regions other than the region 26 is 0.1 μm to 0.3 μm and the gap D3 between the wires 23 in the region 26 is preferably 10% or more or 50% or less of the gap D1. Thereby, the region 26 can be filled in with the nitride film 6 so that the occurrence of the void 9 in the region 26 can be limited as shown in FIG. 49.

As a result short circuiting between the contact parts 24 due to a conductive material filled in within the void 9 can be prevented so that the first effect of the present invention can be gained. The second and the sixth effects of the present invention can also be gained.

(Embodiment 11)

Figure 53:
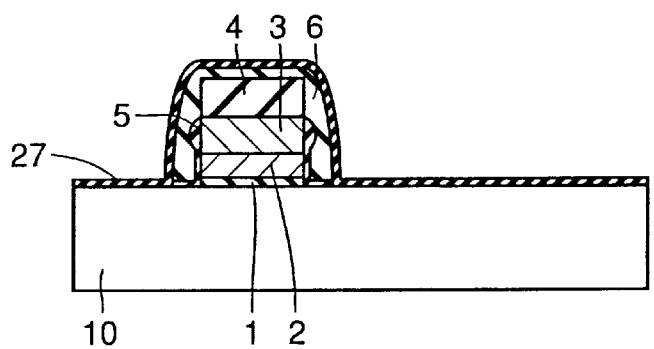
Figure 54:
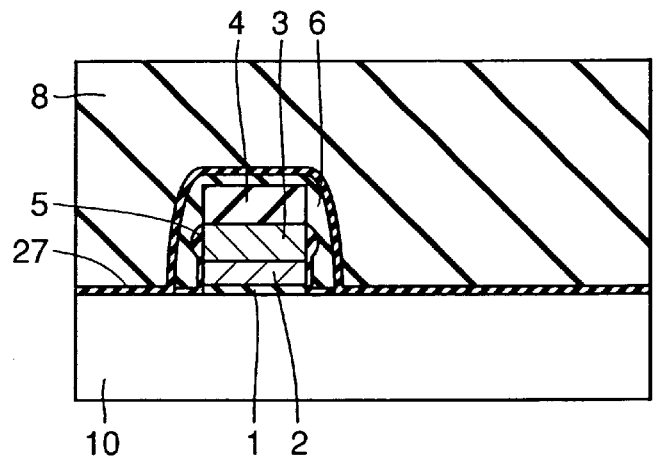

Next, Embodiment 11 according to the present invention is described in reference to FIGS. 52 to 54. FIGS. 52 to 54 are the views showing respective production processes according to the present embodiment.

Important characteristics of the present Embodiment 11 are that a nitride film is utilized as a substrate protective film instead of a silicon oxide film.

First, the nitride film 6 is formed into a side wall shape through the same steps as in Embodiment 4. At this time the nitride film 6 in a side wall form is formed in the peripheral circuit part as shown in FIG. 52. Afterwards, a nitride film 27 is deposited so as to cover the nitride film 6 as shown in FIG. 53. The thickness of the nitride film 27 is 10 nm to 20 nm.

Next, an interlayer oxide film 8 is formed by the same method as in Embodiment 4. At this time, since a nitride film 27 which makes it difficult for oxidation seed to pass through is formed as a protective film of the semiconductor substrate 10, a wet reflow process can be adopted. Thereby, the filling in characteristics of the interlayer oxide film 8 can be improved so that the defective fillings can be limited. As a result the first effect of the present invention can be gained. And the second and the sixth effects of the present invention can also be gained.

(Embodiment 12)

Figure 55:
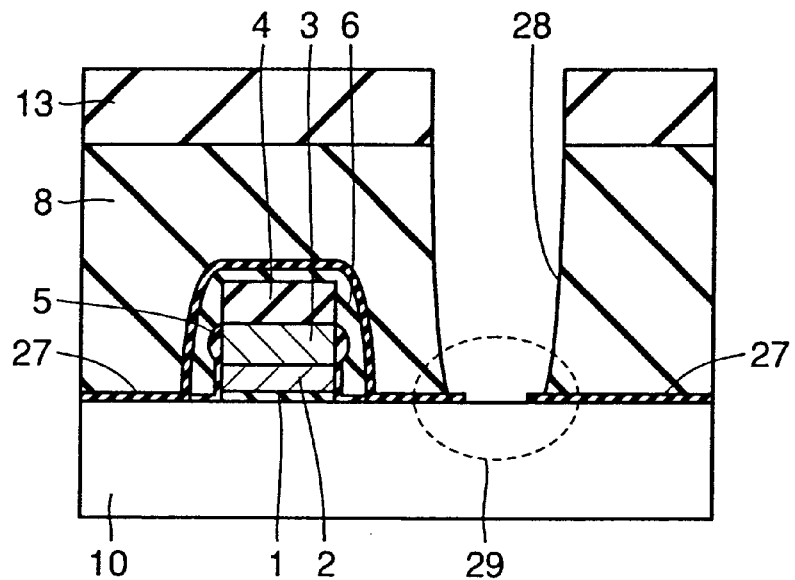
FIGS. 55 and 56 are cross section views showing the first and the second steps of the production process for a semiconductor device according to Embodiment 12 of the present invention.
Figure 56:
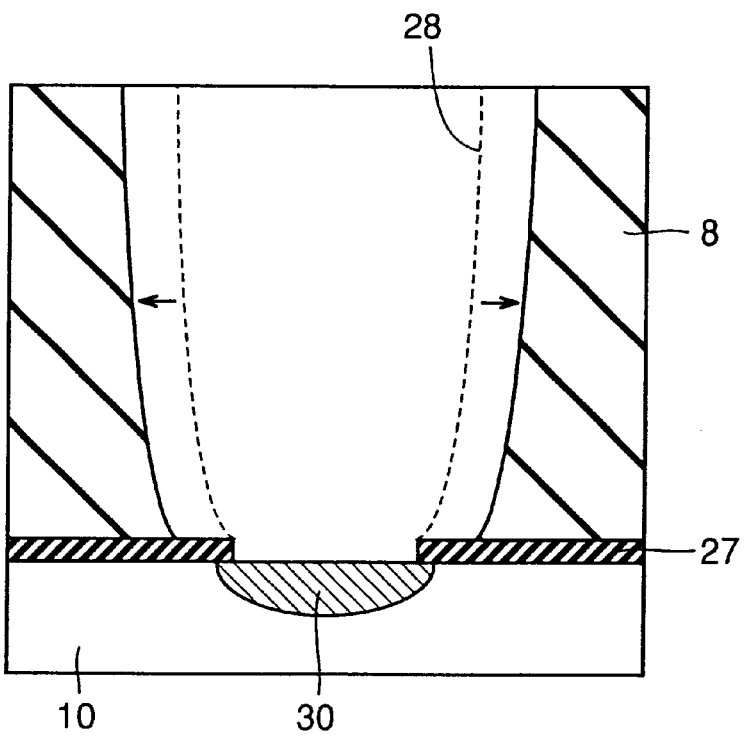

Next, Embodiment 12 according to the present invention is described in reference to FIGS. 55 and 56. FIGS. 55 and 56 are the views showing characteristic production processes according to the present embodiment.

Important characteristics of the present Embodiment 12 are that a silicide part is provided on the bottom of the bit line contact part so as to reduce the bit line contact resistance.

First, a structure as shown in FIG. 54 is generated through the same steps as in Embodiment 11. Next, a silicon oxide film 13 is formed as shown in FIG. 55 and an opening 28 is formed by etching the interlayer oxide film 8 through the usage of silicon oxide film 13 as a mask.

Afterwards, a wet treatment is carried out by using HF. Thereby, the silicon oxide film 13 is etched so that the side walls of the opening 28 are recessed and the parts other than the bottom of the opening 28 are broadened as shown in FIG. 56. Since the nitride film 27 is not etched, however, the edge parts of the nitride film 27 do not recess so that the diameter of the bottom of the opening 28 stays small.

Thereby, the contact area between the bit line (plug part) and the semiconductor substrate 10 becomes small so that the bit line contact resistance increases. Therefore, a silicide layer 30 is formed in the contact part between the bit line and the semiconductor substrate 10. Thereby, the bit line contact resistance can be reduced (eighth effect of the present invention).

The silicide layer 30 is formed by depositing metal such as Co on the bottom of the opening 28 and applying a heat treatment to the metal. After forming the silicide layer 30, metal films 14 and 15 which becomes the plug part are formed. Here, in the case of the present embodiment, the same effects as in Embodiment 11 can be gained.

(Embodiment 13)

Figure 57:
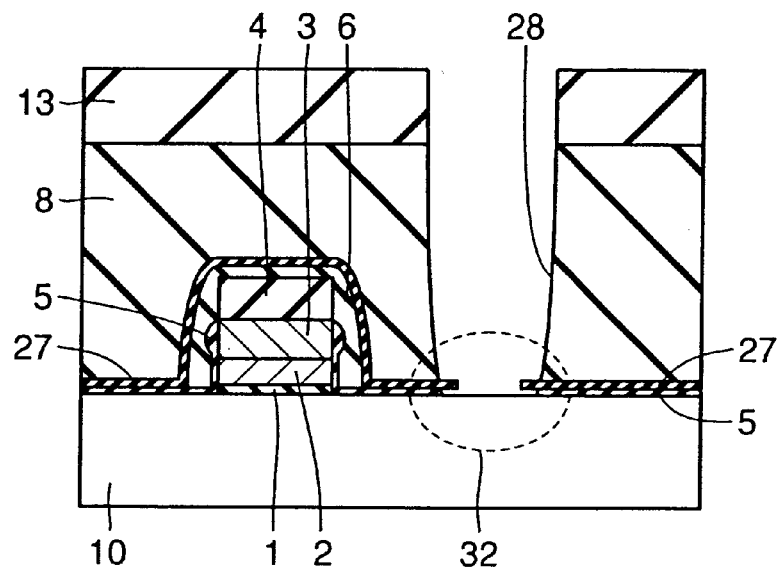
FIG. 57 is a cross section view showing the first step of the production process for a semiconductor device according to Embodiment 13 of the present invention.
Figure 58:
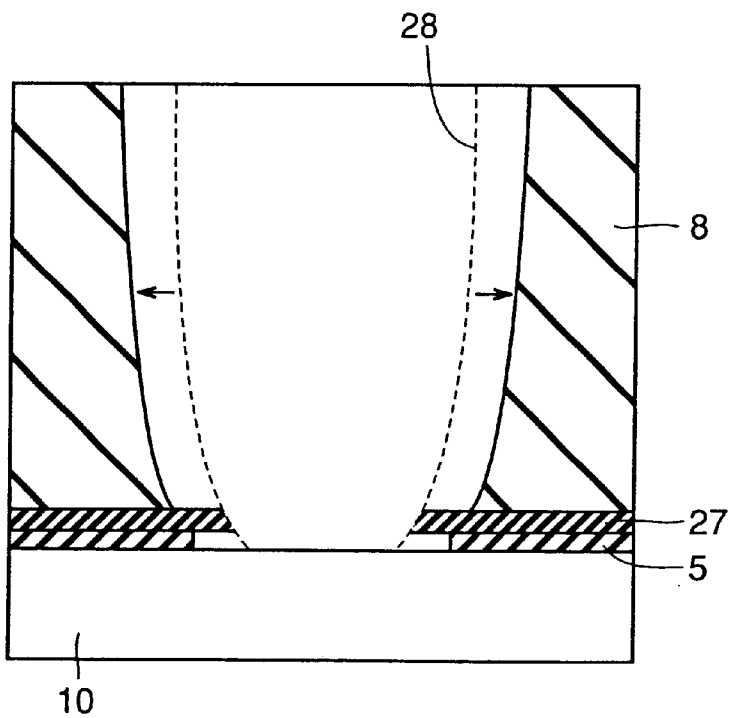
FIG. 58 is an expanded view of a part of the semiconductor device in FIG. 57.
Figure 59:
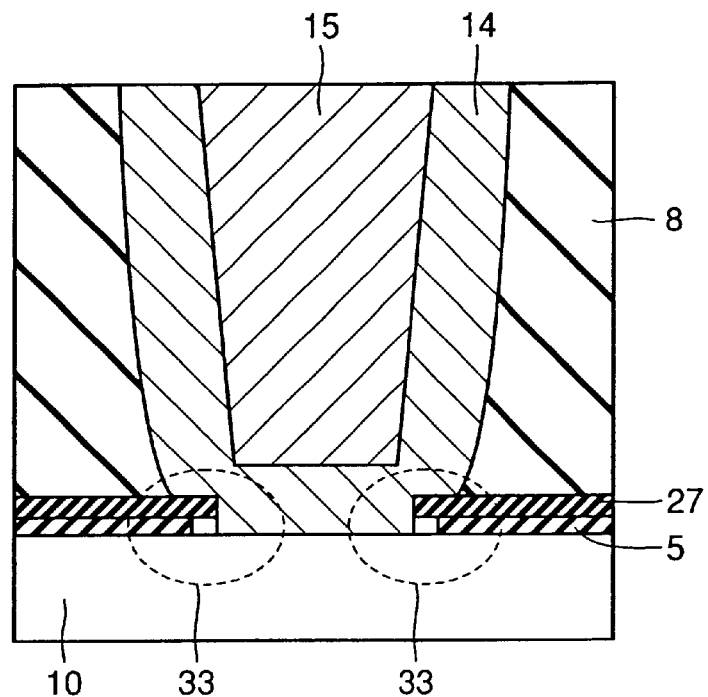
FIG. 59 is a view for describing a problem assumed in the structure in FIG. 58.
Figure 60:
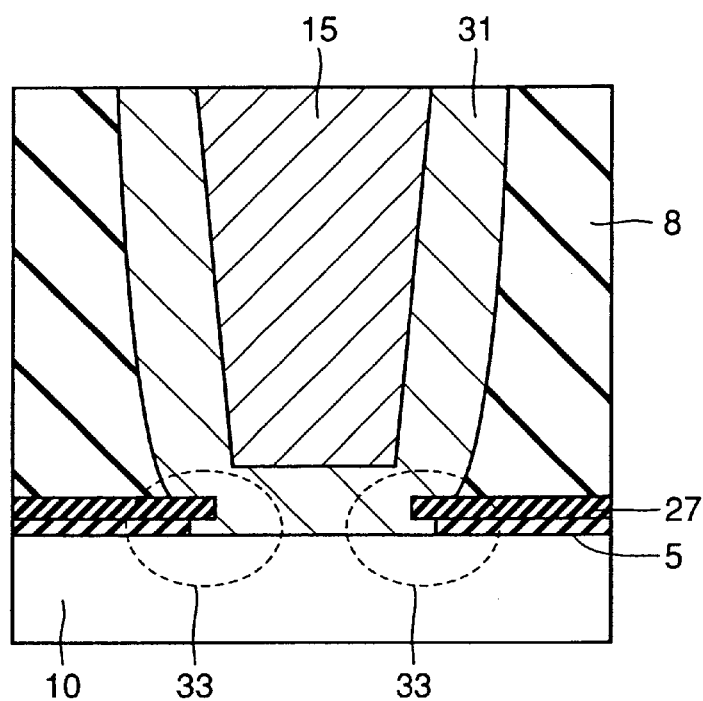
FIG. 60 is a cross section view showing the second step of the production process for a semiconductor device according to Embodiment 13 of the present invention.

Next, Embodiment 13 according to the present invention is described in reference to FIGS. 57 to 60. FIGS. 57, 58 and 60 are the views showing respective production processes according to the present embodiment. FIG. 59 is a view for describing a problem.

Important characteristics of the present Embodiment 13 are that, in the case that a nitride film projects from the bottom of the bit line contact part, a barrier metal is infiltrated under the projecting part so as to reduce the bit line contact resistance.

First, a structure as shown in FIG. 52 is generated through the same steps as in Embodiment 11. At this time there are some cases where the silicon oxide film 5 remains on the main surface of the semiconductor substrate 10. A nitride film 27, an interlayer oxide film 8 and a silicon oxide film 13 are deposited so as to cover silicon oxide film 5 by the above described method and an opening 28 is formed in the interlayer oxide film 8 so as to carry out wet treatment using HF.

Thereby, the side walls of the opening 28 and the edge parts of the silicon oxide film 5 are recessed as shown in FIGS. 57 and 58 so that the opening 28 expands as a whole as shown in FIG. 58. Since the nitride film 27 is not etched, however, the edge parts of the nitride film 27 do not recede so that the edge parts of nitride film 27 project within the opening 28 under the condition such as that of "eaves."

A metal film (barrier metal) 14 is formed by the spattering method within the opening 28 under this condition and a metal film 14 cannot be infiltrated under the nitride film 27 (within the region 33) as shown in FIG. 59. Thereby, the contact area between the bit line (plug part) and the semiconductor substrate 10 becomes small so as to increase the bit line contact resistance.

Then, a metal film (barrier metal: TiN) 31 is formed by a CVD method. The conditions are, for example, the wafer temperature is 600° C., the pressure is 300 mTorr (40 Pa), gasses are TiCl$_4$ (20 sccm: 0.02 l/min) and NH$_3$ (400 sccm: 0.4 l/min).

By forming a metal film 31 by a CVD method in this way, a metal film 31 can be infiltrated under the nitride film 27. Thereby, the contact area between the bit line (plug part) and the semiconductor substrate 10 can be increased so as to gain the eighth effect of the present invention. Here, in the case of the present embodiment, the same effects as in Embodiment 11 can be gained.

As described above, according to the present invention the defective fillings of the interlayer insulation film between the wires can be limited and, therefore, a void is prohibited from being formed within the interlayer oxide film. Thereby, short circuits between the plug parts due to a conductive material filled in into the void can be limited.

Since only processes such as rounding the hard mask film or a nitride film thereon are carried out it becomes unnecessary to introduce a new device and, therefore, the devices can be manufactured at low cost.

In addition, the side walls of the regions between the wires can be gently sloped and, therefore, the recess on the top of the plug parts can be formed at the time when plug parts are formed in the regions between the wires. Thereby, the contact areas between the plug parts and the upper layer wires can be increased so that the contact resistance between the plug parts and the upper layer wires can be reduced and, as a result, the driving ability of the transistors can be increased.

In addition, since the upper edge corner parts of the nitride film on the hard mask film can be of obtuse angles or can be rounded, the stress of the upper layer can be dispersed in the vicinity of the above edge corner parts of the nitride film so as to make interface peeling more difficult to occur. And it also becomes difficult for the steep steps between the wires to remain so, therefore, the dimension fluctuation by halation in the photolithography process for forming the upper layer can be limited and it also becomes possible to eliminate an anti-reflection coating. Thereby, it becomes possible to reduce the cost and limit the dimension fluctuation due to the etching loss.

In addition, the filling in characteristics of the interlayer isolation film can be increased and the reflow temperature of the interlayer isolation film can be lowered. Thereby, deterioration of the short channel characteristics of the transistors can be limited.

Moreover, in the case that the nitride film extends on the main surface of the substrate, this nitride film can be made to function as an etching stopper at the time of forming the contact hole so that the etching damage to the substrate can be reduced. Thereby, the refresh characteristics are increased.

In addition, in the case that a silicide layer or the like is formed on the main surface of the substrate located immediately below the contact holes it becomes possible to reduce the contact resistance between the upper layer wires and the substrate and a device with high performance can be gained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having a main surface;
   wires formed on said main surface with an insulation film interposed;
   a hard mask film on said wires;
   a nitride film covering said hard mask film and having rounded upper edge corner parts;
   an interlayer insulation film covering said nitride film; and
   plug parts formed within said interlayer insulation film.

2. The semiconductor device according to claim 1, wherein the width a of the rounded parts in said nitride film is in a range of $0<a<L/2$ and the height b of said rounded parts is in a range of $0<b<H$ where the width of said nitride film located on said hard mask film is denoted as L and the height from the bottom of said hard mask film to the top of said nitride film is denoted as H.

3. The semiconductor device according to claim 1, wherein said hard mask film has rounded upper edge corner parts.

4. The semiconductor device according to claim 3, wherein the width a of the rounded upper edge corner parts in said hard mask film is in a range of $0<a<L/2$ and the height b of said rounded parts is in a range of $0<b<H$ where the width of said hard mask film is denoted as L and the height thereof is denoted as H.

5. A semiconductor device comprising:
   a semiconductor substrate having a main surface;
   wires, comprising a silicon film and a suicide film thereon, formed on said main surface with an insulation film interposed;
   a hard mask film on said wires;
   an oxide film formed on the side walls of said wires;
   a nitride film covering said hard mask film and said oxide film;
   an interlayer insulation film covering said nitride film; and
   plug parts formed within said interlayer insulation film, wherein:
      the surfaces of said oxide film extend in the direction substantially perpendicular to said main surface without locally projecting to the side; and
      the side walls of said silicide film are located inward of the side walls of said silicon film.

6. The semiconductor device according to claim 5, wherein
   a shift amount of the sides of said silicide film to the inner sides of said wires from the sides of said hard mask film is ½ or more and ⅔ or less times as large as the thickness of said oxide film located on the side walls of said silicon film.

7. A semiconductor device comprising:
   a semiconductor substrate having a main surface;
   wires formed on said main surface with an insulation film interposed;
   a hard mask film on said wires;
   a side wall insulation film extending from the side walls of said wires to the side walls of said hard mask film;
   a nitride film formed on said side wall insulation film;
   an interlayer insulation film covering said nitride film; and
   plug parts formed within said interlayer insulation film.

8. The semiconductor device according to claim 7, wherein the value of b1/a1 is larger than 2 and smaller than 15 where the width of the bottom of said side wall isolation film is denoted as a1 and the height of said side wall insulation film is denoted as b1.

9. A semiconductor device comprising:
   a semiconductor substrate having a main surface;
   wires formed on said main surface with a first insulation film interposed;
   a hard mask film on said wires;
   a nitride film covering said hard mask film;
   an interlayer insulation film covering said nitride film and having contact holes which reach said main surface;
   a second insulation film covering the side walls of said contact holes; and
   plug parts formed within regions surrounded by said second insulation film.

10. A semiconductor device comprising:
    a semiconductor substrate having a main surface;
    element isolation regions selectively formed on said semiconductor substrate;
    first and second wires which are formed on said main surface with an insulation film interposed and which extend on said element isolation regions;
    first and second hard mask films on said first and second wires;
    a nitride film covering said first and second hard mask films;

an interlayer insulation film covering said nitride film;

plug parts formed within said interlayer insulation film;

first regions located on said isolation regions, where the gap between said first and said second wires is relatively wide; and second regions located on said isolation regions, where the gap between said first and said second wires is relatively narrow.

11. The semiconductor device according to claim 10, wherein the gap between said first and said second wires in said first regions is 1.2 times or more and 2.0 times or less of the gap between said first and said second wires in said second regions.

12. The semiconductor device according to claim 10, wherein the gap between said first and said second wires in said second regions is 10% or more and 50% or less of the gap between said first and said second wires in said first regions.

13. The semiconductor device according to claim 12, wherein said second regions are filled in with said nitride film.

14. A semiconductor device comprising:

a semiconductor substrate having a main surface;

wires formed on said main surface with an insulation film interposed;

a hard mask film on said wires;

a first nitride film covering said hard mask film and the side walls of said wires;

a second nitride film covering said first nitride film and extending on said main surface;

an interlayer insulation film covering said second nitride film; and plug parts formed within said interlayer insulation film.

15. The semiconductor device according to claim 14, wherein:

said interlayer insulation film has contact holes which reach said main surface;

said plug parts are formed within said contact holes; and a silicide layer is formed on said main surface located directly beneath each of said plug parts.

16. The semiconductor device according to claim 14, further comprising an oxide film between said second nitride film and said main surface, wherein:

said interlayer insulation film has contact holes which reach said main surface;

said plug parts are formed within said contact holes;

edges of said second nitride film project toward insides of said contact holes; and said plug parts partially extend beneath the projecting parts of said second nitride film.

17. A process for a semiconductor device comprising the steps of:

forming wires and a hard mask film on a main surface of a semiconductor substrate with an insulation film interposed;

forming a nitride film so as to cover said hard mask film;

rounding the upper edge corner parts of said nitride film;

forming an interlayer insulation film so as to cover said nitride film; and forming plug parts within said interlayer insulation film.

18. The process for a semiconductor device according to claim 17, wherein a plurality of said wires are formed and said step of rounding the upper edge corner parts of said nitride film includes a step of etching said upper edge corner parts of said nitride film under the condition where a resist is left between said wires.

19. A process for a semiconductor device comprising the steps of:

forming wires and a hard mask film on a main surface of a semiconductor substrate with an insulation film interposed;

rounding upper edge corner parts of said hard mask film;

forming a nitride film so as to cover said hard mask film;

forming an interlayer insulation film so as to cover said nitride film; and forming plug parts within said interlayer insulation film.

20. The process for a semiconductor device according to claim 19, wherein a plurality of said wires are formed and said step of rounding the upper edge corner parts of said hard mask film includes a step of etching said upper edge corner parts of said hard mask film under the condition where a resist is left between said wires.

21. A process for a semiconductor device comprising the steps of:

forming wires, which include a silicon film and a silicide film, and a hard mask film on a main surface of a semiconductor substrate with an insulation film interposed;

sifting the sides of said silicide film toward insides of said wires from the sides of said silicon film;

forming an oxide film on the side walls of said wires;

forming a nitride film so as to cover said hard mask film and said oxide film;

forming an interlayer insulation film so as to cover said nitride film; and forming plug parts within said interlayer insulation film.

22. A process for a semiconductor device comprising the steps of:

forming wires and a hard mask film on a main surface of a semiconductor substrate with a first insulation film interposed;

forming a second insulation film so as to cover said hard mask film;

forming a side wall insulation film extending from the side walls of said wires to the side walls of said hard mask film by etching said second isolation film;

forming a nitride film so as to cover said side wall insulation film;

forming an interlayer insulation film so as to cover said nitride film; and forming plug parts within said interlayer insulation film.

23. A process for a semiconductor device comprising the steps of:

forming wires and a hard mask film on a main surface of a semiconductor substrate with a first insulation film interposed;

forming a nitride film so as to cover said hard mask film;

forming an interlayer insulation film so as to cover said nitride film;

forming contact holes in said interlayer insulation film;

forming a second insulation film covering the side walls of said contact holes; and forming plug parts within regions surrounded by said second insulation film.

24. A process for a semiconductor device comprising the steps of:

forming wires and a hard mask film on a main surface of a semiconductor substrate with an insulation film interposed;

forming a first nitride film so as to cover said hard mask film;

forming a side wall insulation film on the side walls of said wires and said hard mask film by etching said first nitride film;

forming a second nitride film so as to cover said side wall insulation film and to extend on said main surface;

forming an interlayer insulation film so as to cover said second nitride film; and forming plug parts within said interlayer insulation film.

\* \* \* \* \*